(12) United States Patent
Yamamoto et al.

(10) Patent No.: US 8,409,786 B2
(45) Date of Patent: Apr. 2, 2013

(54) PATTERN FORMING METHOD AND METHOD FOR MANUFACTURING SEMICONDUCTOR DEVICE

(75) Inventors: Tomohiko Yamamoto, Kawasaki (JP); Satoru Asai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 867 days.

(21) Appl. No.: 11/848,786

(22) Filed: Aug. 31, 2007

(65) Prior Publication Data

US 2007/0298353 A1    Dec. 27, 2007

Related U.S. Application Data

(63) Continuation-in-part of application No. 11/529,678, filed on Sep. 29, 2006, now abandoned.

(30) Foreign Application Priority Data

May 24, 2006  (JP) .................................. 2006-144343
Feb. 28, 2007  (JP) .................................. 2007-050730

(51) Int. Cl.
    *G03F 7/20*    (2006.01)
(52) U.S. Cl. ........................................ 430/311; 430/394
(58) Field of Classification Search .................. 430/311, 430/5, 394
    See application file for complete search history.

(56) References Cited

U.S. PATENT DOCUMENTS

| | | | |
|---|---|---|---|
| 6,855,486 B1 * | 2/2005 | Finders et al. | 430/394 |
| 7,074,524 B2 | 7/2006 | Yamamoto et al. | |
| 7,371,489 B2 | 5/2008 | Yamamoto et al. | |
| 7,386,830 B2 | 6/2008 | Fukuhara | |
| 7,790,335 B2 | 9/2010 | Minami | |
| 2004/0023128 A1 * | 2/2004 | Yamamoto et al. | 430/5 |
| 2005/0164129 A1 | 7/2005 | Minami | |
| 2006/0046168 A1 | 3/2006 | Fukuhara | |
| 2006/0210930 A1 | 9/2006 | Yamamoto et al. | |
| 2007/0105387 A1 * | 5/2007 | Blatchford et al. | 438/710 |

FOREIGN PATENT DOCUMENTS

| | | |
|---|---|---|
| JP | 2001126983 | 5/2001 |
| JP | 2004-062095 A | 2/2004 |
| WO | 2004/077155 A1 | 9/2004 |

OTHER PUBLICATIONS

Japanese Office Action dated Oct. 25, 2011, issued in corresponding Japanese Patent Application No. 2007-050730.

* cited by examiner

*Primary Examiner* — Brittany Raymond
(74) *Attorney, Agent, or Firm* — Westerman, Hattori, Daniels & Adrian, LLP

(57) ABSTRACT

Double exposure is performed by using a pair of photomasks, an attenuated phase shift mask or the like which is not an alternating phase shift mask, and a pattern is transferred onto a photoresist. Here, on the occasion of performing exposure with the photomask for forming a finer pattern, double pole illumination is used as an illumination system.

15 Claims, 22 Drawing Sheets

PRIOR ART

PATTERN FORMING METHOD AND METHOD FOR MANUFACTURING SEMICONDUCTOR DEVICE

CROSS-REFERENCE TO RELATED APPLICATIONS

This is a continuation-in-part application of application Ser. No. 11/529,678, filed Sep. 29, 2006.

This application is based upon and claims the benefit of priority from the prior Japanese Patent Application Nos. 2006-144343, filed on May 24, 2006, and 2007-050730, filed on Feb. 28, 2007, the entire contents of which are incorporated herein by reference.

BACKGROUND OF THE INVENTION

1. Field of the Invention

The present invention relates to a pattern forming method, and a method for manufacturing a semiconductor device of a liquid crystal display device or the like, and is particularly preferable for application in forming a gate electrode of an extremely fine size.

2. Description of the Related Art

With high integration density of semiconductor elements, microfabrication of patterns formed by lithography has been developed. As a method for forming a micropattern with high accuracy, a multiple exposure process using an alternating phase shift mask is proposed.

The method of the multiple exposure process will be described by using FIG. 26.

For example, when a gate layer in a logic circuit of a semiconductor device is formed, an element isolation region 101, and an active region 102 defined by the element isolation region 101 exist on a silicon substrate as shown in FIG. 26A. The gate layer is usually formed laterally across the active region 102.

On forming the gate layer, first mask patterns 104 are exposed on a photoresist (not shown) of the silicon substrate by using a first photomask 103 which is an ordinary chrome mask, an attenuated phase shift mask, or the like. Thereafter, as shown in FIG. 26B, second mask patterns 106 are exposed (double-exposure) on the photoresist by using a second photomask 105 which is an alternating phase shift mask so as to be superimposed on the first mask patterns 104.

The alternating phase shift mask is constructed so that the phases of the adjacent mask patterns are shifted by $\pi$ (180°) from each other. With exposure by using the alternating phase shift mask, the light intensity becomes very steep, and a very large depth of focus can be obtained by using a relatively small illumination system. As a result, as shown in FIG. 26C, gate layers 111 which are made narrow only above the active region 102 are formed. When the gate layer is formed with double (multiple) exposure like this, an extremely large exposure margin can be obtained as compared with single exposure.

The alternating phase shift mask is capable of desired microfabrication with an extremely large margin as described above, but on the other hand, it has the great problems that its manufacture process is complicated and manufacture cost is high. The problem of a three-dimensional structure of the alternating phase shift mask cannot be neglected. On manufacturing an alternating phase shift mask, a lower part of a light shield film between 0 and $\pi$ is in an eaves-shape. This is made to have the three-dimensional structure to eliminate imbalance of intensity of light passing through each opening. However, when miniaturization of the processing dimension increases, and the light shield film becomes smaller, this is expected to be a great problem in manufacture of photomasks.

In this respect, the art of Japanese Patent Application Laid-open No. 2001-126983 is proposed as a multiple exposure process. This art is the art of dividing a mask data into two on forming a pattern of one layer, and transferring the divided patterns by using illumination systems and optical conditions which are optimized for the respective patterns and by using double pole illumination as at least one illumination system. This is a multiple exposure process without using an alternating phase shift mask, and is advantageous in the respect that the manufacture cost is low. However, this method has the problem that since one photomask is used for one pattern, a sufficient manufacture process margin cannot be obtained when exposing a number of patterns.

SUMMARY OF THE INVENTION

A manufacturing method of a semiconductor device of the present invention includes a first exposing step of exposing a first mask pattern onto a transfer object by using a first photomask, and a second exposing step of exposing a second mask pattern onto the transfer object by using a second photomask so that at least a part of it is superimposed on the first mask pattern, exposure is performed by using double pole illumination in at least one of the above described first exposure step and the above described second exposure step.

A manufacturing method of a semiconductor device of the present invention includes a first exposing step of exposing at least two kinds of first mask patterns differing in an extending direction onto a transfer object by using a first photomask, a second exposing step of exposing respective second mask patterns onto the transfer object so that at least parts of them are superimposed on the first mask patterns by using a second photomask, exposure is performed by using quadrupole illumination in at least one of the above described first exposure step and the above described second exposure step.

A pattern forming method of the present invention includes a first step of exposing a first mask pattern onto a transfer object by using a first photomask, and a second step of exposing a second mask pattern onto the transfer object by using a second photomask so that at least a part of it is superimposed on the first mask pattern, exposure is performed by using double pole illumination in at least one of the above described first step and the above described second step.

DETAILED DESCRIPTION OF THE PREFERRED EMBODIMENTS

Figure 1A:
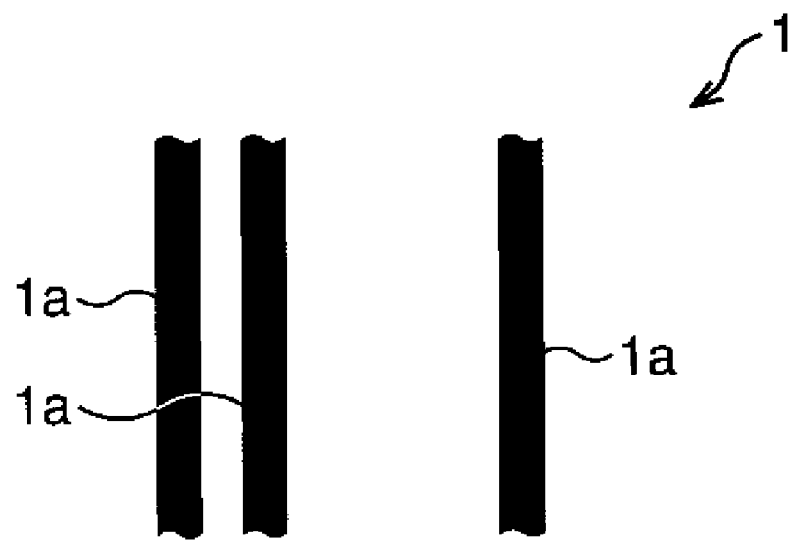
FIGS. 1A and 1B are schematic plane views showing a pair of photomasks used in a first embodiment.

The present invention is premised on the recognition that in order to form a micropattern with high accuracy with a sufficient manufacture process margin, a multiple exposure process is essential.

As each photomask used for the multiple exposure process, instead of using an expensive photomask with a complicated construction like an alternating phase shift mask, an ordinary photomask such as a chrome mask or an attenuated phase shift mask, for example, is used. On this occasion, for exposure using at least one photomask among a plurality of photomasks, a so-called modified illumination system is used as an illumination system optimized for the most frequent pattern in the photomask.

More specifically, when the most frequent pattern is a band-shaped pattern extending in one direction, exposure is performed by using a double pole illumination including a pair of illumination modes at regions orthogonal to the extending direction as the modified illumination system. Device design is performed so that a sufficient manufacture process margin can be obtained with the optimized illumination system. Alternatively, the optical conditions are determined so that the sufficient manufacture process margin can be obtained. Further, manufacture of the device is performed after it can be confirmed that the sufficient manufacture process margin is obtained. By using such a method, it becomes possible to obtain a sufficient device manufacture process margin at low reticle cost.

When a band-shaped pattern extending in the first direction, and a band-shaped pattern extending in the second direction orthogonal to the first direction exist as the most frequent pattern, the following two kinds of methods are effective.

As the first method, two kinds of double pole illumination differing in illumination modes are used as the illumination system.

First, exposure is performed by using a first photomask including a first mask pattern extending in a first direction and a first mask pattern extending in a second direction orthogonal to the first direction. Next, exposure is performed by using a second photomask including a second mask pattern extending in the first direction so that the second mask pattern is superimposed on the first mask pattern extending in the first direction. Subsequently, exposure is performed by the double pole illumination of the illumination mode corresponding to the second direction by using a third photomask including a third mask pattern extending in the second direction so that the third mask pattern is superimposed on the first mask pattern extending in the second direction.

As the second method, a quadrupole illumination is used as an illumination system.

First, exposure is performed by using a first photomask including a first mask pattern extending in a first direction and a first mask pattern extending in a second direction orthogonal to the first direction as in the first method. Next, exposure is performed by using a second photomask including a second mask pattern extending in the first direction and a second mask pattern extending in the second direction by using the quadrupole illumination as a modified illumination system. In this case, in the quadrupole illumination, one pair of illumination modes correspond to the second mask pattern extending in the second direction, for example, and the other pair of illumination modes correspond to the second mask pattern orthogonal to them, for example, extending in, for example, the first direction.

PREFERRED EMBODIMENTS

Embodiments of the present invention will now be described in detail with reference to the drawings.

First Embodiment

In this embodiment, the case where a gate layer pattern is transferred onto a photoresist above a semiconductor substrate by a photolithography technique will be shown as an example. In this case, the gate layer is a conductive member which extends in a band shape from a portion above an element isolation region to a portion above an active region, and for convenience of explanation, the portion above the active region will be called a gate electrode, and the portion on the element isolation region will be called a gate wiring.

Figure 1B:
Figure 2A:
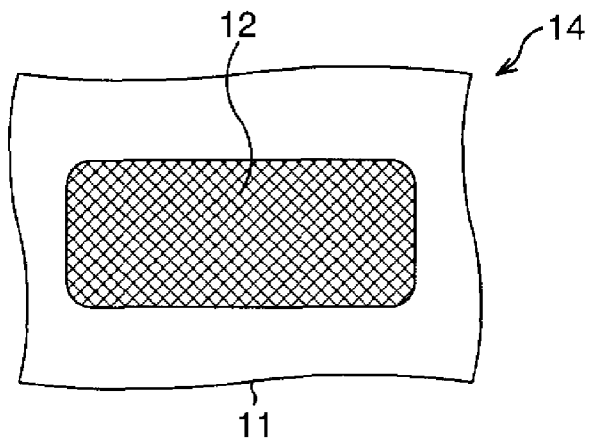
FIGS. 2A to 2C are schematic plane views for explaining a pattern forming method according to the first embodiment.
Figure 2B:
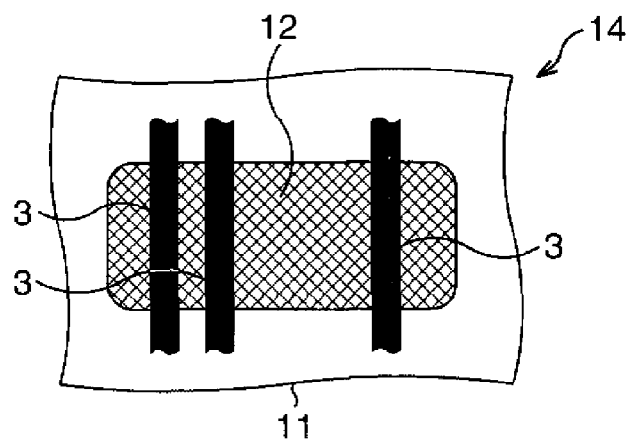
Figure 2C:
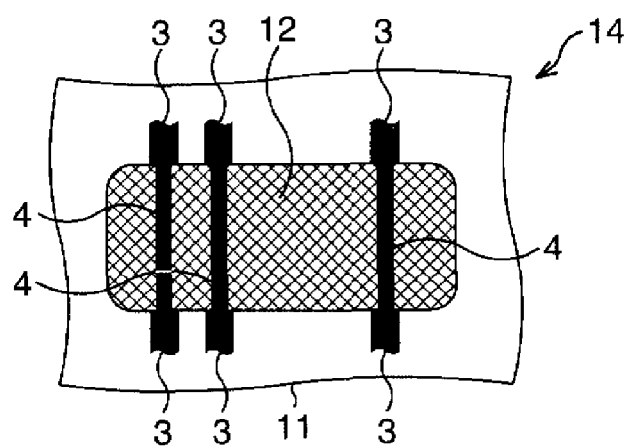

FIGS. 1A and 1B are schematic plane views showing a pair of photomasks used in a first embodiment, and FIGS. 2A to 2C are schematic plane views for explaining a pattern forming method according to the first embodiment.

In this embodiment, the gate layer is formed by performing double exposure by using a first photomask 1 and a second photomask 2 as shown in FIGS. 1A and 1B.

The first photomask 1 is an ordinary chrome mask, an attenuated phase shift mask or the like, and is made by forming band-shaped first mask patterns 1a each having a width corresponding to the gate wiring to be formed, as shown in FIG. 1A.

The second photomask 2 is an ordinary chrome mask, an attenuated phase shift mask or the like which is not an alternating phase shift mask as the first photomask 1, and is made by forming second mask patterns 2a each having a width (narrower than the gate wiring) corresponding to the gate electrode to be formed, and narrower than the first mask pattern 1a so as to overlap the first mask pattern 1a, as shown in FIG. 1B.

As shown in FIG. 2A, an element isolation region 11, and an active region 12 which is defined by the element isolation region 11 are formed on the silicon substrate which is a transfer object. In this state, a gate insulating film, a polycrystalline silicon film, and an etching hard mask such as a silicon oxide film (all not shown) are formed in sequence on the active region, and a photoresist 14 and an antireflection film (not shown) are coated and formed on the entire surface.

First, as shown in FIG. 2B, the first mask patterns 1a are exposed onto the photoresist 14 above the silicon substrate by using the first photomask 1. By this exposure, latent images of the gate wiring patterns 3 extending laterally across the active region 12 following (the reduction projection images of) the first mask patterns 1a are transferred onto the photoresist 14.

Subsequently, the second mask patterns 2a are exposed onto the photoresist 14 to overlap the first mask patterns 1a above the active region 12 by using the second photomask 2. In this embodiment, double pole illumination is used as an illumination system on the occasion of exposure. In this case, if the most frequent pattern is the band-shaped pattern which extends in one direction, as the double pole illumination which is optimized for the most frequent pattern, exposure is performed by using double pole illumination including a pair of illumination modes at the regions orthogonal to the extending direction as the illumination system. Even if the mask pattern to be exposed is extremely fine to such an extent that it is formed with high accuracy by using, for example, an alternating phase shift mask, it becomes possible to transfer the mask pattern with high accuracy with an extremely large exposure margin equivalent to the case where an alternating phase shift mask is used, by performing exposure with the double pole illumination which is optimized for the most frequent pattern in an ordinary chrome mask, an attenuated phase shift mask or the like.

Figure 3A:
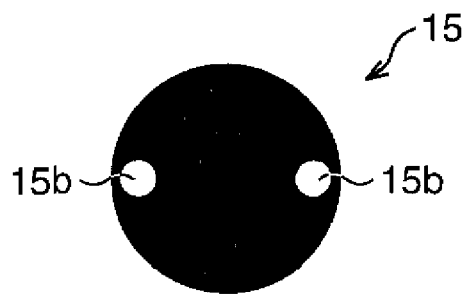
FIGS. 3A to 3C are schematic plane views showing one example of double pole illumination.

More specifically, in the second photomask 2, the second mask patterns 2a are in the shapes which extend in the vertical direction in FIG. 1B, and therefore, as shown in FIG. 3A, double pole illumination 15 including a pair of illumination modes 15a and 15b at the regions orthogonal to the extending direction (namely, the straight line connecting the illumination modes 15a and 15b extends in the lateral direction in FIG. 1B) is used as the illumination system. By performing exposure by using the double pole illumination 15 with a pair of illumination modes 15a and 15b located in the lateral direction, which is optimized for the second mask pattern 2a, it becomes possible to obtain very steep light intensity to the second mask patterns 2a extending in the vertical direction, without using a special photomask like an alternating phase shift mask. Accordingly, it becomes possible to transfer the second mask patterns 2a onto the photoresist 14 with high accuracy with an extremely large exposure margin equivalent to the case where an alternating phase shift mask is used.

Figure 3B:
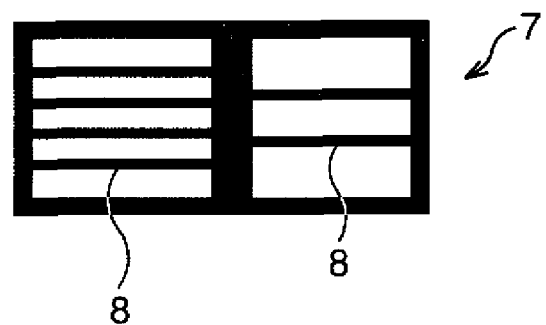
Figure 3C:
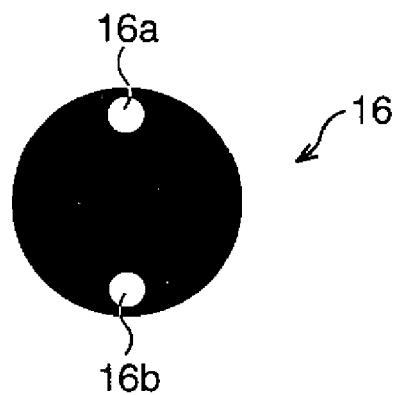

In this embodiment, the case where the most frequent patterns are the second mask patterns 2a extending in the vertical direction is shown as an example, but when the most frequent pattern of a second photomask 7 is a second mask pattern 8 extending in the lateral direction in the drawing as shown, for example, in FIG. 3B, double pole illumination 16 including a pair of illumination modes 16a and 16b at the regions orthogonal to the extending direction (namely, the straight line connecting the illumination modes 16a and 16b extends in the vertical direction in FIG. 3C) is used as an illumination system, as shown in FIG. 3C.

By the above described double exposure, in the photoresist 14, the gate wiring patterns 3 remain above the element isolation region 11, because the second mask patterns 2a are not superimposed on the first mask patterns 1a. On the other hand, above the active region 12, the second mask patterns 2a are superimposed on the first mask patterns 1a. Therefore, gate electrode patterns 4 extending above the active region 12 following (the reduction projection images of) the second mask patterns 2a are transferred onto the photoresist 14.

The above described exposure may be performed by using a polarized light illumination system having the function of the double pole illumination. The polarized light illumination system is an illumination system which is constructed so that light irradiated to a photomask (reticle) is in a linearly polarized state unlike the illumination system using ordinary light in an unpolarized state, and by performing exposure by combining the function of the double pole illumination in the polarized light illumination system, the effect of enhancing contrast of light intensity more than at the time of the unpolarized state is provided.

Figure 4:
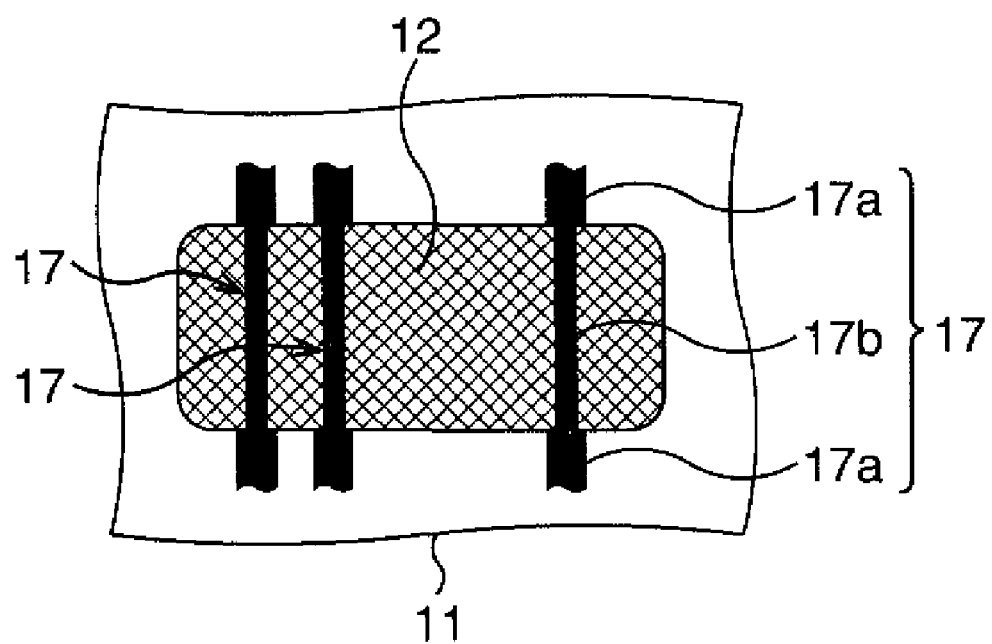
FIG. 4 is a schematic plane view showing a resist pattern formed according to the first embodiment.

Then, by performing development or the like of the photoresist 14, a resist pattern 17 is formed as shown in FIG. 4.

The resist pattern 17 is made by integrally forming patterns 17a and 17b so that the pattern 17a corresponding to the wide gate wiring pattern 3 is located above the element isolation region 11, and the pattern 17b which corresponds to the gate electrode pattern 4 and is narrower than the pattern 17a is located above the active region 12. Here, the gate electrode pattern 4 is transferred onto the photoresist 14 with extremely high accuracy by exposure using the above described double pole illumination 15, and therefore, the pattern 17b is formed to have a predetermined fine width with high accuracy.

In this embodiment, the gate layer is formed by using the above described pattern forming method, and, for example, an MOS transistor including the gate layer is produced.

Figure 5A:
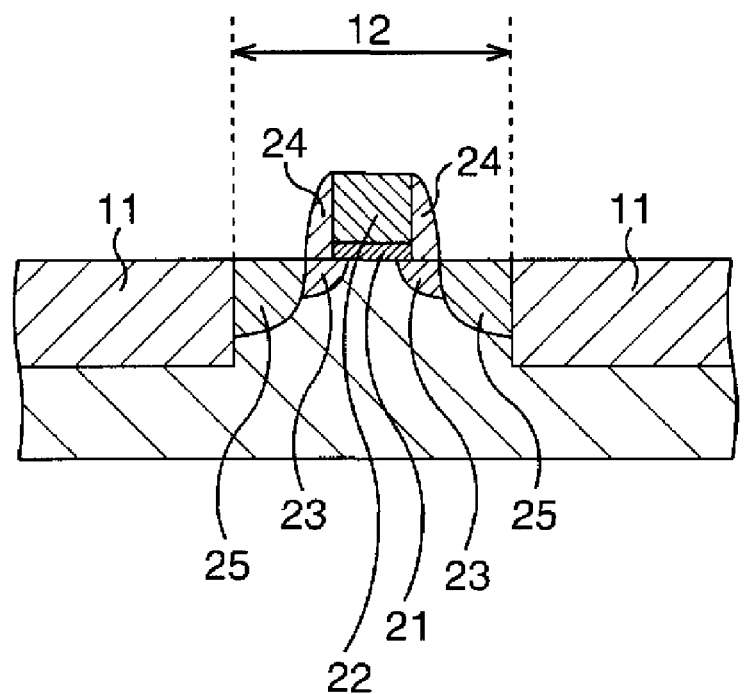
FIGS. 5A and 5B are schematic views showing a MOS transistor produced according to the first embodiment.
Figure 5B:
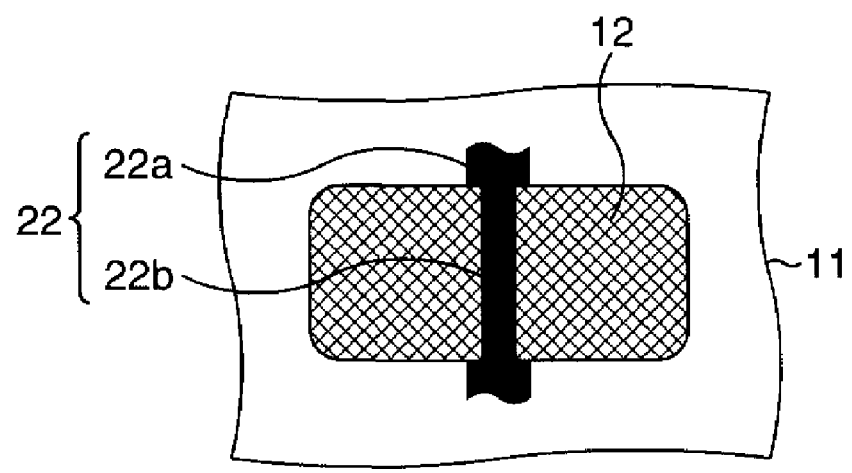

FIG. 5A is a schematic sectional view showing a produced MOS transistor, and FIG. 5B is a schematic plane view showing a state in which the gate layer is formed.

First, an element isolation structure is formed on a silicon substrate by, for example, an STI (Shallow Trench Isolation) method as the element isolation region 11, and the active region 12 is defined.

Subsequently, the surface of the active region 12 is, for example, thermally oxidized, and a thin gate insulating film 21 is formed. A conductive film, for example, a polycrystalline silicon film (not shown) is deposited on the gate insulating film 21 by a CVD method or the like.

Subsequently, the resist pattern 17 is formed by using the above described pattern forming method. Then, the polycrystalline silicon film is processed by dry etching using the resist pattern 17 as a mask, and the gate layer 22 in the shape following the resist pattern 17 is formed. The gate layer 22 is made by integrally forming a gate wiring 22a and a gate electrode 22b so that the wide gate wiring 22a is located on the element isolation region 11, and the gate electrode 22b which is narrower than the gate wiring 22a is located on the active region 12 via the gate insulating film 21 as shown in FIG. 5B.

Subsequently, after the resist pattern 17 is removed by ashing or the like, an impurity (boron ($B^+$) or the like in the case of a PMOS transistor, phosphorous ($P^+$), arsenide ($As^+$) or the like in the case of an NMOS transistor) is ion-implanted into a surface layer of the active region 12 with the gate electrode 22 as a mask to a relatively low concentration, and an LDD region 23 is formed.

Subsequently, an insulating film, for example, a silicon oxide film (not shown) is deposited on an entire surface to cover the gate electrode 22 by a CVD method or the like, and the entire surface of the silicon oxide film is subjected to anisotropic etching (etch back). By the etch back, the silicon oxide film is left on only both side surfaces of the gate electrode 22, and side wall spacers 24 are formed.

Subsequently, an impurity (boron ($B^+$) or the like in the case of a PMOS transistor, phosphorous ($P^+$), arsenide ($As^+$) or the like in the case of an NMOS transistor) is ion-implanted into a surface layer of the active region 12 with the gate electrode 22 and the side wall spacers 24 as a mask to a concentration higher than the LDD region 23, and a source/drain region 25 which is partially superimposed on the LDD region 23 is formed.

Thereafter, by undergoing a forming process step of wiring layers or the like electrically connected to the interlayer insulating film and the source/drain region 25, the MOS transistor is completed.

As described above, according to this embodiment, the micropattern can be formed with high accuracy with a sufficient manufacture process margin without using a photomask complicated in manufacture process at high manufacture cost like an alternating phase shift mask.

By applying the pattern forming method to formation of the gate layer 22, a fine MOS transistor including the gate layer 22 of a desired fine width can be produced with high accuracy.

MODIFICATION EXAMPLES

Here, various modification examples of the first embodiment will be described. Various composing members and the like which are the same as those in the first embodiment are assigned with the same reference numerals and characters, and the detailed explanation thereof will be omitted.

Modification Example 1

Figure 6A:
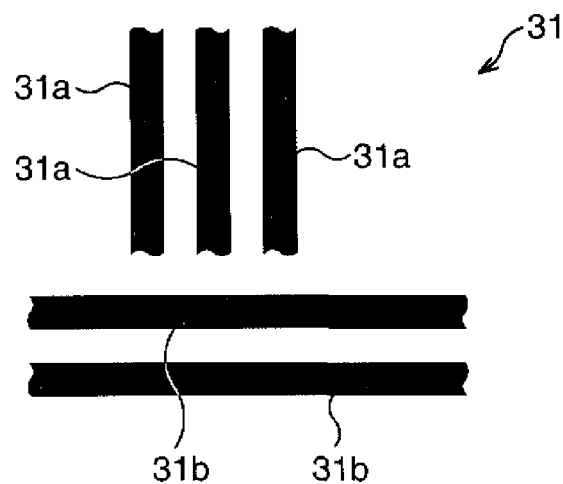
FIGS. 6A to 6C are schematic plane views showing a pair of photomasks used in a modification example 1 of the first embodiment.
Figure 6B:
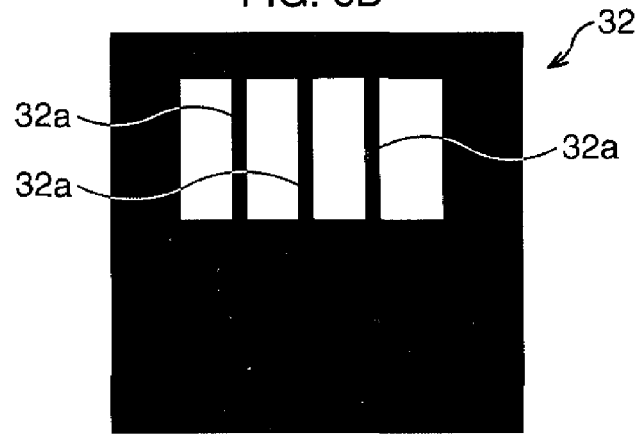
Figure 6C:
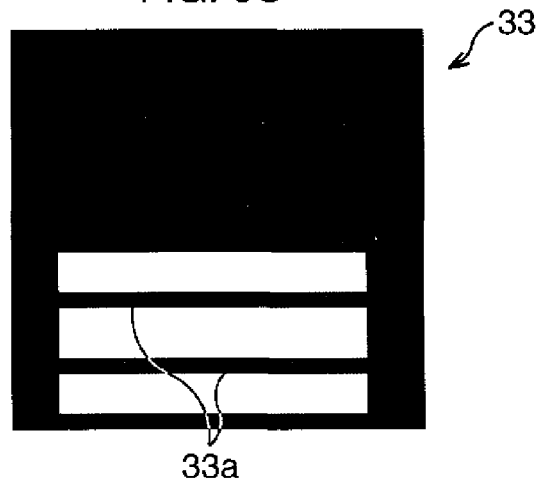
Figure 7A:
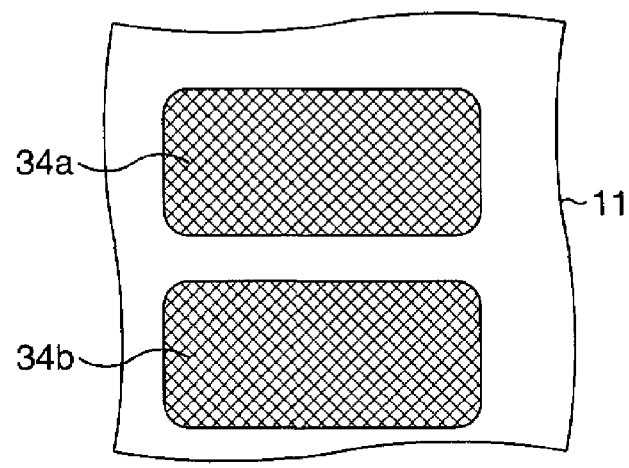
FIGS. 7A to 7C are schematic plane views for explaining a pattern forming method according to the modification example 1 of the first embodiment.
Figure 7B:
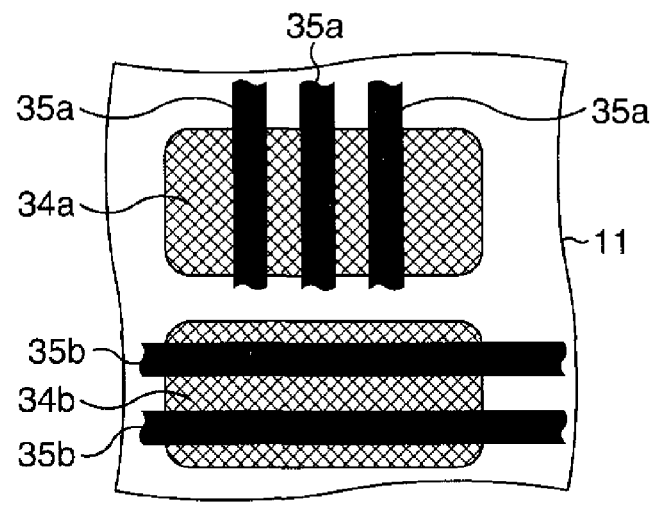
Figure 7C:
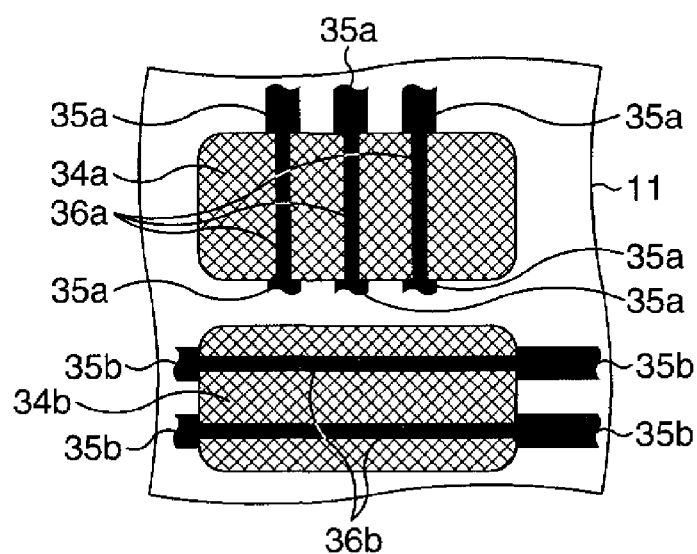

FIGS. 6A to 6C are schematic plane views showing a pair of photomasks used in a modification example 1, and FIGS. 7A to 7C are schematic plane views for explaining a pattern forming method according to the modification example 1.

In this example, respective gate layers differing in the extending direction are formed by double exposure using a first photomask 31 and a second photomask 32, and double exposure using the first photomask 31 and a third photomask 33, as shown in FIGS. 6A to 6C.

The first photomask 31 is an ordinary chrome mask, an attenuated phase shift mask or the like, and is made by forming band-shaped first mask patterns 31a each having the width corresponding to a gate wiring to be formed and extending in a vertical direction in the drawing, and band-shaped first mask patterns 31b each having the width corresponding to the gate wiring to be formed and extending in a direction orthogonal to the first mask patterns 31a, in this case, in the lateral direction in the drawing.

The second photomask 32 is an ordinary chrome mask, an attenuated phase shift mask, or the like which is not an alternating phase shift mask as the first photomask 31. The second photomask 32 is made by forming second mask patterns 32a is formed to overlap the first mask pattern 31a as shown in FIG. 6B. The second mask patterns 32a is made to have the width corresponding to a gate electrode to be formed (narrower width than the gate wiring), and is a band-shaped mask pattern which is narrower than the first mask pattern 31a and extends in the vertical direction.

The third photomask 33 is an ordinary chrome mask, an attenuated phase shift mask or the like which is not an alternating phase shift mask as the first photomask 31. The third photomask 33 is made by forming third mask patterns 33a to overlap the first mask patterns 31b as shown in FIG. 6C. The third mask pattern 33a is made to have the width corresponding to a gate electrode to be formed (narrower width than the gate wiring), and is a band-shaped mask pattern which is narrower than the first mask pattern 31b and extends in the lateral direction.

As shown in FIG. 7A, on a silicon substrate which is a transfer object, the element isolation region 11, and active regions 34a and 34b which are defined by the element isolation region 11 are formed. The active region 34a is formed into a rectangle longer in the lateral direction in the drawing, and the active region 34b is formed into a rectangle longer in the vertical direction in the drawing. In this state, a gate insulating film, a polycrystalline silicon film and an etching hard mask such as a silicon oxide film (all are not shown) are formed in sequence on the active regions 34a and 34b, and the photoresist 14 and the antireflection film (not shown) are coated and formed on the entire surface.

First, as shown in FIG. 7B, the first mask patterns 31a and 31b are exposed onto the photoresist 14 above the silicon substrate by using the first photomask 31. By the exposure, latent images of gate wiring patterns 35a extending laterally across the active region 34a following (the reduction projection images of) the first mask patterns 31a, and latent images of gate wiring patterns 35b extending longitudinally across the active region 34b following (the reduction projection images of) the first mask patterns 31b are respectively transferred onto the photoresist 14.

Subsequently, by using the second photomask 32, the second mask patterns 32a are exposed onto the photoresist 14 to overlap the first mask patterns 31a above the active region 34a.

Further, by using the third photomask 33, the third mask patterns 33a are exposed onto the photoresist 14 to overlap the first mask patterns 31b above the active region 34b.

In this example, on the occasion of exposure using the second photomask 32 and the third photomask 33 respectively, double pole illumination is used as the illumination systems. In this case, as the double pole illumination optimized for the most frequent patterns, when the most frequent pattern is a band-shaped pattern extending in one direction, double pole illumination including a pair of illumination modes at the regions orthogonal to the extending direction is used as the illumination system, and exposure is performed. If the mask pattern to be exposed is extremely fine to such an extent that it is formed with high accuracy by using, for example, an alternating phase shift mask, it is possible to transfer the mask pattern with high accuracy with an extremely large exposure margin as in the case where the alternating phase shift mask is used, by performing exposure with the double pole illumination optimized for the most frequent pattern in an ordinary chrome mask, an attenuated phase shift mask or the like.

More specifically, in the second photomask 32, the second mask pattern 32a is formed into the shape extending in the vertical direction in FIG. 6B, and therefore, as shown in FIG. 3A of the first embodiment, the double pole illumination 15 including a pair of illumination modes 15a and 15b at the regions orthogonal to the extending direction (namely, the straight line connecting the illumination modes 15a and 15b extends in the lateral direction in FIG. 1B) is used as the illumination system.

In the third photomask 33, the third mask pattern 33a is formed into the shape extending in the lateral direction in FIG. 6C, and therefore, as shown in FIG. 3C of the first embodiment, the double pole illumination 16 including a pair of illumination modes 16a and 16b at the regions orthogonal to the extending direction (namely, the straight line connecting the illumination modes 16a and 16b extends in the vertical direction in FIG. 3B) is used as the illumination system.

As described above, by performing exposure by using the double pole illumination 15 with a pair of illumination modes 15a and 15b located in the lateral direction, which is optimized for the second mask pattern 32a, and the double pole illumination 16 with a pair of illumination modes 16a and 16b located in the lateral direction, which is optimized for the third mask pattern 33a, it becomes possible to obtain very steep light intensity for the second mask pattern 32a extending in the vertical direction and the third mask pattern 33a extending in the lateral direction without using a special photomask like an alternating phase shift mask. Accordingly, it becomes possible to transfer the second mask pattern 32a and the third mask pattern 33a onto the photoresist 14 with high accuracy with the extremely large exposure margin as in the case where an alternating phase shift mask is used.

Since in the photoresist 14, above the element isolation region 11, the second mask patterns 32a are not superimposed on the first mask patterns 31a, and the third mask patterns 33a are not superimposed on the first mask patterns 31b by the above described double pole exposure as shown in FIG. 7C, the gate wiring patterns 35a and 35b remain. On the other hand, above the active region 34a, the second mask patterns 32a are superimposed on the first mask patterns 31a, and above the active region 34b, the third mask patterns 33a are superimposed on the first mask patterns 31b. Therefore, gate electrode patterns 36a extending above the active region 34a following (the reduction projection images) of the second mask patterns 32a, and gate electrode patterns 36b extending above the active region 34b following (the reduction projection images) of the third mask patterns 33a are respectively transferred onto the photoresist 14.

In this example, the above described exposure may be performed by using a polarized light illumination system having the function of the double pole illumination as in the first embodiment.

Figure 8:
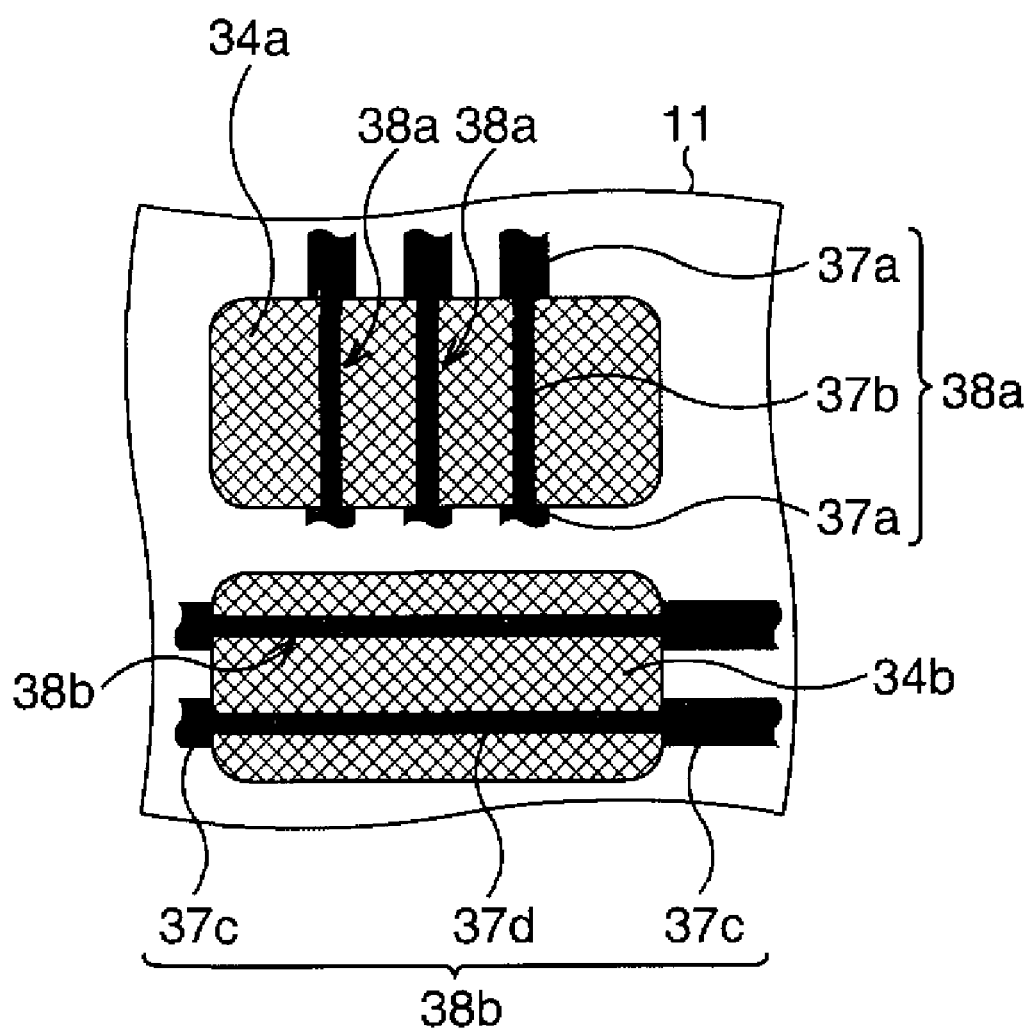
FIG. 8 is a schematic plane view showing a resist pattern formed according to the modification example 1 of the first embodiment.

Subsequently, by performing development or the like of the photoresist 14, resist patterns 38a and 38b are formed as shown in FIG. 8.

The resist pattern 38a is made by integrally forming patterns 37a and 37b so that the pattern 37a corresponding to the wide gate wiring pattern 35a are located above the element isolation region 11, and the pattern 37b corresponding to the gate electrode pattern 36b and narrower than the pattern 37a is located above the active region 34a.

The resist pattern 38b is made by integrally forming patterns 37c and 37d so that the pattern 37c corresponding to the wide gate wiring pattern 35b is located above the element isolation region 11, and the pattern 37d corresponding to the gate electrode pattern 36b and narrower than the pattern 37c is located above the active region 34b.

In this case, the gate electrode patterns 36a and 36b are transferred onto the photoresist 14 with extremely high accuracy by exposure using the above described double pole illumination 15 and double pole illumination 16, respectively, and therefore, the patterns 37b and 37d are formed to have predetermined fine widths respectively with high accuracy.

As described above, according to this example, the micropatterns can be formed with high accuracy with a sufficient manufacture process margin without using a photomask complicated in manufacture process at high manufacture cost like an alternating phase shift mask.

As in the first embodiment, by applying the pattern forming method to formation of the gate layer, a fine MOS transistor including a gate layer with a desired fine width can be produced with high accuracy.

Modification Example 2

Figure 9A:
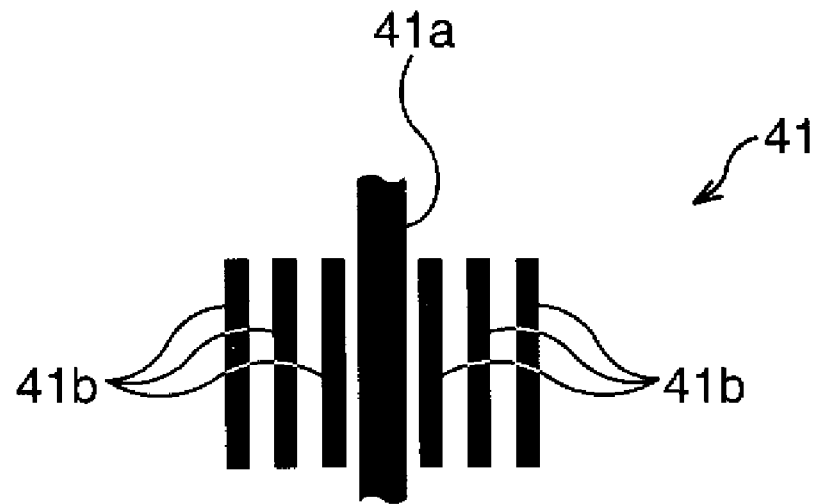
FIGS. 9A and 9B are schematic plane views showing a pair of photomasks used in a modification example 2 of the first embodiment.
Figure 9B:
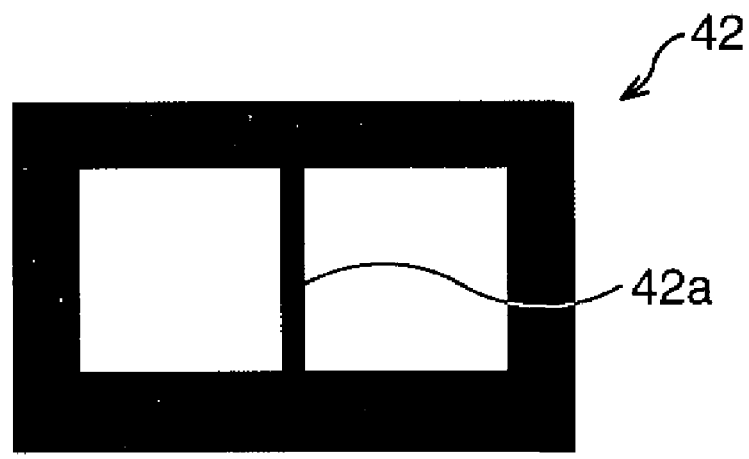
Figure 10A:
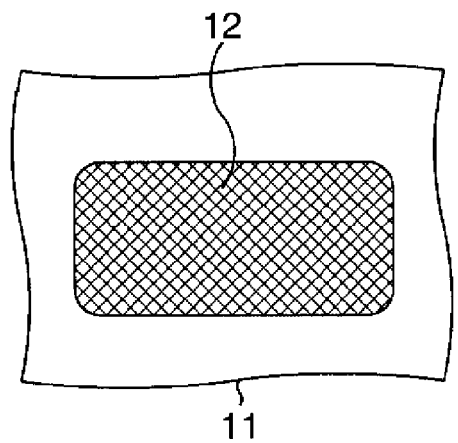
FIGS. 10A to 10C are schematic plane views for explaining a pattern forming method according to the modification example 2 of the first embodiment.
Figure 10B:
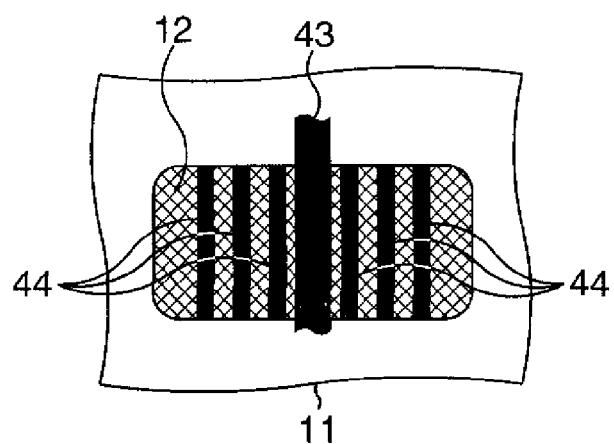
Figure 10C:
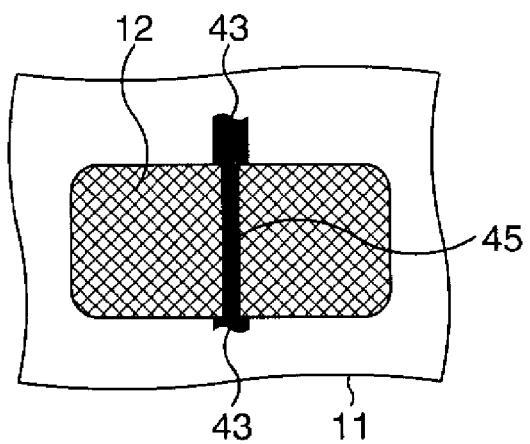

FIGS. 9A and 9B are schematic plane views showing a pair of photomasks used in a modification example 2, and FIGS. 10A to 10C are schematic plane views for explaining a pattern forming method according to the modification example 2.

In this example, a gate layer is formed by performing double exposure using a first photomask 41 and a second photomask 42 as shown in FIGS. 9A and 9B. As photomasks 41 and 42, photomasks each with one gate pattern formed are shown as an example, but they are strictly for the purpose of convenience of explanation, and it is naturally possible to apply this modification example to a photomask including a plurality of gate patterns as in FIGS. 1A and 1B of the first embodiment.

The first photomask 41 is an ordinary chrome mask, an attenuated phase shift mask or the like, and is made by forming a band-shaped first mask pattern 41a having a width corresponding to a gate wiring to be formed, and a plurality of auxiliary mask patterns 41b provided side by side as a striped pitch pattern in parallel with the first mask pattern 41a. The auxiliary mask patterns 41b are formed to further enhance a process margin on the occasion of exposing the first mask pattern 41a.

The second photomask 42 is an ordinary chrome mask, an attenuated phase shift mask or the like which is not an alternating phase shift mask as the first photomask 41 as shown in FIG. 9B, and is made by forming a band-shaped second mask pattern 42a having a width corresponding to a gate electrode to be formed (narrower than the gate wiring) and is narrower than the first mask pattern 41a to overlap the first mask pattern 41a. In this case, in the second photomask 42, the exposed portions of the auxiliary mask patterns 41b correspond to the light transmitting portions of the second photomask 42, and the auxiliary mask patterns 41b do not overlap the second mask pattern 42a.

Usually, an assist feature assists exposure of a mask pattern, and therefore, the assist feature itself needs to be in the state in which it is not transferred (for example, to be formed to have the width not more than exposure limit). Like this, the assist feature has a large constraint imposed on its size while it obtains an extremely large process margin. On the other hand, in this example, the exposed portions of the auxiliary mask patterns 41b correspond to the light transmitting portions of the second photomask 42, and therefore, the auxiliary mask patterns 41b do not have to be especially formed into the state in which they are not transferred. Therefore, if a single exposure using only the first photomask 41 is performed, the auxiliary mask patterns 41b can be formed to have such sizes as are transferred with the first mask pattern 41a. Namely, in this example, a constraint is not imposed on the size of the auxiliary mask pattern 41b, and an extremely large process margin can be obtained.

As shown in FIG. 10A, on a silicon substrate which is a transfer object, the element isolation region 11, and the active region 12 which is defined by the element isolation region 11 are formed. In this state, a gate insulating film, a polycrystalline silicon film, and an etching hard mask such as a silicon oxide film (all not shown) are formed in sequence on the active region 12, and the photoresist 14 and the antireflection film (not shown) are coated and formed on the entire surface.

First, as shown in FIG. 10B, the first mask pattern 41a and the auxiliary mask patterns 41b are exposed onto the photoresist 14 above the silicon substrate by using the first photomask 41. By the exposure, a latent image of a gate wiring pattern 43 extending laterally across the active region 12 following (the reduction projection image of) the first mask patterns 41a is transferred onto the photoresist 14. At this time, the auxiliary mask patterns 41b are formed to have the widths not more than the exposure limit to obtain a process margin, and therefore, latent images of the striped assist features 44 are transferred in the photoresist 14 to be adjacent to the gate wiring pattern 43.

Subsequently, by using the second photomask 42, the second mask pattern 42a is exposed onto the photoresist 14 to overlap the first mask pattern 41a above the active region 12. In this example, double pole illumination is used as an illumination system on the occasion of the exposure. In this case, as the double pole illumination optimized for the most frequent pattern, when the most frequent pattern is a band-shaped pattern extending in one direction, double pole illumination including a pair of illumination modes at the regions orthogonal to the extending direction is used as the illumination system, and exposure is performed. Even if the mask pattern to be exposed is extremely fine to such an extent that it is formed with high accuracy by using, for example, an alternating phase shift mask, it becomes possible to transfer the mask pattern with high accuracy with an extremely large exposure margin equivalent to the case where the alternating phase shift mask is used, by performing exposure with the double pole illumination optimized for the most frequent pattern in an ordinary chrome mask, an attenuated phase shift mask or the like.

More specifically, in the second photomask 42, the second mask pattern 42a is formed into the shape extending in the vertical direction in FIG. 9B, and therefore, as shown in FIG. 3A of the first embodiment, the double pole illumination 15 including a pair of illumination modes 15a and 15b at the regions orthogonal to the extending direction (namely, the straight line connecting the illumination modes 15a and 15b extends in the lateral direction in FIG. 1B) is used as the illumination system. By performing exposure by using the double pole illumination 15 with a pair of illumination modes 15a and 15b located in the lateral direction, which is optimized for the second mask pattern 42a like this, it becomes possible to obtain very steep light intensity for the second mask pattern 42a extending in the vertical direction, without using a special photomask like an alternating phase shift mask. Accordingly, it becomes possible to transfer the second mask pattern 42a onto the photoresist 14 with high accuracy with an extremely large exposure margin equivalent to the case where an alternating phase shift mask is used.

In this case, as described above, the exposed portions of the auxiliary mask patterns 41b correspond to the light transmitting portions of the second photomask 42, and therefore, the assist features 44, which are the transfer images of the auxiliary mask patterns 41b, disappear by the double exposure.

In this example, the case where the most frequent pattern is the second mask pattern 42a extending in the vertical direction is shown as an example, but when the most frequent pattern of the second photomask 7 is the second mask pattern 8 extending in the lateral direction in the drawing as shown in FIG. 3B as in, for example, the first embodiment, the double pole illumination 16 including a pair of illumination modes 16a and 16b at the regions orthogonal to the extending direction (namely, the straight line connecting the illumination modes 16a and 16b extends in the vertical direction in FIG. 3C) as shown in FIG. 3C is used as the illumination system.

By the above described double exposure, in the photoresist 14, above the element isolation region 11, the second mask pattern 42a is not superimposed on the first mask pattern 41a as shown FIG. 10C, and therefore, the gate wiring pattern 43 remains. On the other hand, above the active region 12, the second mask pattern 42a is superimposed on the first mask pattern 41a. Therefore, a gate electrode pattern 45 extending above the active region 12 following (the reduction projection image) of the second mask pattern 42a is transferred onto the photoresist 14.

In this example, the above described exposure is performed by using a polarized light illumination system having the function of the double pole illumination as in the first embodiment.

Figure 11:
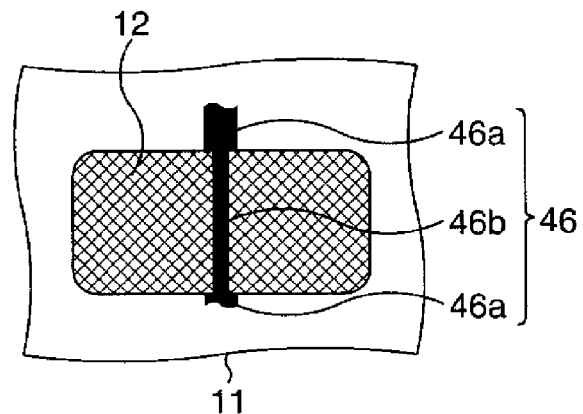
FIG. 11 is a schematic plane view showing a resist pattern formed according to the modification example 2 of the first embodiment.

Subsequently, by performing development or the like of the photoresist 14, a resist pattern 46 is formed as shown in FIG. 11.

The resist pattern 46 is made by integrally forming patterns 46a and 46b so that the pattern 46a corresponding to the wide gate wiring pattern 43 is located above the element isolation region 11, and the pattern 46b corresponding to the gate electrode pattern 45 and narrower than the pattern 46a is located above the active region 12. In this case, the gate electrode pattern 45 is transferred onto the photoresist 14 with extremely high accuracy by exposure using the above described double pole illumination 15, and therefore, the pattern 46b is formed to have a predetermined fine width with high accuracy.

As described above, according to this example, the micropattern can be formed with high accuracy with a sufficient manufacture process margin without using a photomask complicated in manufacture process at high cost like an alternating phase shift mask.

By applying the pattern forming method to formation of the gate layer as in the first embodiment, a fine MOS transistor including a gate layer with a desired fine width can be produced with high accuracy.

Modification Example 3

Figure 12A:
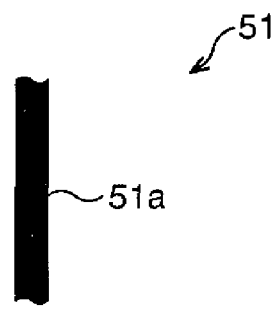
FIGS. 12A and 12B are schematic plane views showing a pair of photomasks used in a modification example 3 of the first embodiment.
Figure 12B:
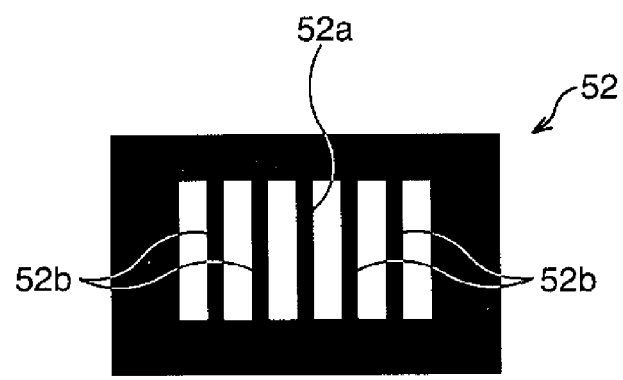
Figure 13A:
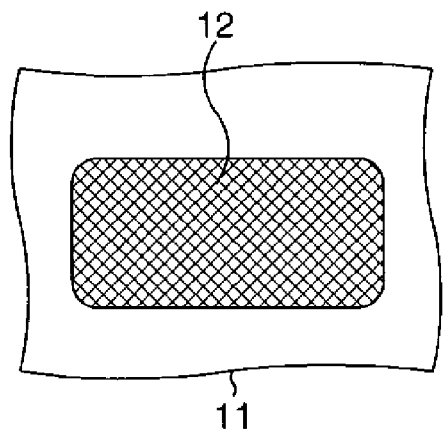
FIGS. 13A to 13C are schematic plane views for explaining a pattern forming method according to the modification example 3 of the first embodiment.
Figure 13B:
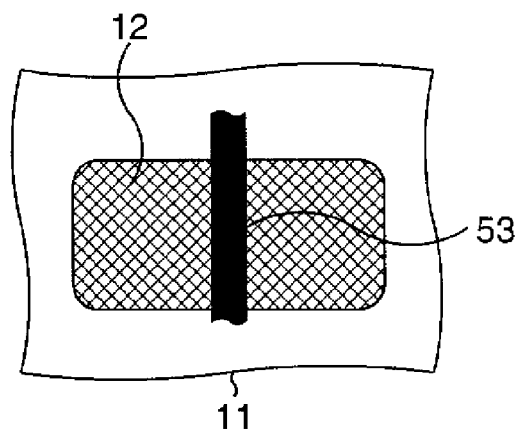
Figure 13C:
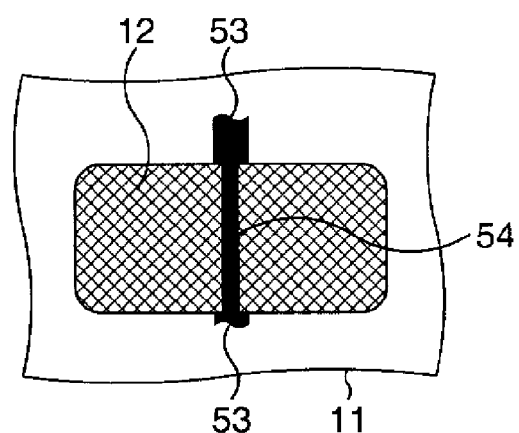

FIGS. 12A and 12B are schematic plane view showing a pair of photomasks used in a modification example 3, and FIGS. 13A to 13C are schematic plane view for explaining a pattern forming method according to the modification example 3.

In this example, a gate layer is formed by performing double exposure by using a first photomask 51 and a second photomask 52 as shown in FIGS. 12A and 12B. As photomasks 51 and 52, photomasks each with one gate pattern formed are shown as examples, but they are strictly for the purpose of convenience of explanation, and it is naturally possible to apply this modification example to a photomask including a plurality of gate patterns as in FIGS. 1A and 1B of the first embodiment.

The first photomask 51 is an ordinary chrome mask, an attenuated phase shift mask or the like, is made by forming a band-shaped first mask pattern 51a having a width corresponding to a gate wiring to be formed.

The second photomask 52 is an ordinary chrome mask, an attenuated phase shift mask or the like which is not an alternating phase shift mask as the first photomask 51. The second photomask 52 is made by forming a band-shaped second mask pattern 52a which has a width corresponding to a gate electrode to be formed (narrower than the gate wiring) and is narrower than the first mask pattern 51a to overlap the first mask pattern 51a, and a plurality of auxiliary mask patterns 52b provided side by side as a striped pitch pattern in parallel with the second mask pattern 52a. The auxiliary mask patterns 52b are formed to further enhance the process margin on the occasion of exposing the second mask pattern 52a. In this case, in the second photomask 52, the exposed portions of the auxiliary mask patterns 52b correspond to the light transmitting portions of the first photomask 51, and the auxiliary mask patterns 52b do not overlap the first mask pattern 51a.

Usually, an assist feature assists exposure of a mask pattern, and therefore, the assist feature itself needs to be in the state in which it is not transferred (for example, to be formed to have the width not more than exposure limit). Like this, the assist feature has a large constraint imposed on its size while it obtains an extremely large process margin. On the other hand, in this example, the exposed portions of the auxiliary mask patterns 52b correspond to the light transmitting portions of the first photomask 51, and therefore, the auxiliary mask patterns 52b do not have to be specially formed into the state in which they are not transferred. Therefore, if a single exposure using only the second photomask 52 is performed, the auxiliary mask pattern 52b can be formed to have such a size as is transferred with the second mask pattern 52a. Namely, in this example, a constraint is not imposed on the size of the auxiliary mask pattern 52b, and an extremely large process margin can be obtained.

As shown in FIG. 13A, on a silicon substrate which is a transfer object, the element isolation region 11, and the active region 12 which is defined by the element isolation region 11 are formed. In this state, a gate insulating film, a polycrystalline silicon film, and a etching hard mask such as a silicon oxide film (all not shown) are formed in sequence on the active region 12, and the photoresist 14 and the antireflection film (not shown) are coated and formed on the entire surface.

First, as shown in FIG. 13B, the first mask pattern 51a is exposed onto the photoresist 14 above the silicon substrate by using the first photomask 51. By the exposure, a latent image of a gate wiring pattern 53 extending laterally across the active region 12 following (the reduction projection image of) the first mask patterns 51a is transferred onto the photoresist 14.

Subsequently, by using the second photomask 52, the second mask pattern 52a and the auxiliary mask patterns 52b are exposed onto the photoresist 14 to overlap the first mask pattern 51a above the active region 12. In this example, double pole illumination is used as a illumination system on the occasion of the exposure. In this case, as the double pole illumination optimized for the most frequent pattern, when the most frequent pattern is a band-shaped pattern extending in one direction, double pole illumination including a pair of illumination modes at the regions orthogonal to the extending direction is used as the illumination system, and exposure is performed. If the mask pattern to be exposed is extremely fine to such an extent that it is formed with high accuracy by using, for example, an alternating phase shift mask, it becomes possible to transfer the mask pattern with high accuracy with an extremely large exposure margin equivalent to the case where the alternating phase shift mask is used, by performing exposure with the double pole illumination optimized for the most frequent pattern in an ordinary chrome mask, an attenuated phase shift mask or the like.

More specifically, in the second photomask 52, the second mask pattern 52a is formed into the shape extending in the vertical direction in FIG. 12B, and therefore, as shown in FIG. 3A of the first embodiment, the double pole illumination 15 including a pair of illumination modes 15a and 15b at the regions orthogonal to the extending direction (namely, the straight line connecting the illumination modes 15a and 15b extends in the lateral direction in FIG. 1B) is used as the illumination system. By performing exposure by using the double pole illumination 15 with a pair of illumination modes 15a and 15b located in the lateral direction, which is optimized for the second mask pattern 52a like this, it becomes possible to obtain very steep light intensity for the second mask pattern 52a extending in the vertical direction, without using a special photomask like an alternating phase shift mask. Accordingly, it becomes possible to transfer the second mask pattern 52a onto the photoresist 14 with high accuracy with an extremely large exposure margin equivalent to the case where an alternating phase shift mask is used.

In this case, the auxiliary mask pattern 52b is formed to have a width of not less than exposure limit to obtain a process margin, and therefore, the striped assist features are exposed onto be adjacent to the gate wiring pattern 53 in the photoresist 14. However, as described above, the exposed portions of the auxiliary mask patterns 52b correspond to the light transmitting portions of the first photomask 51, and therefore, the auxiliary mask patterns 52 are not transferred by the double exposure, and only the second mask pattern 52a is transferred onto the photoresist 14.

Figure 14:
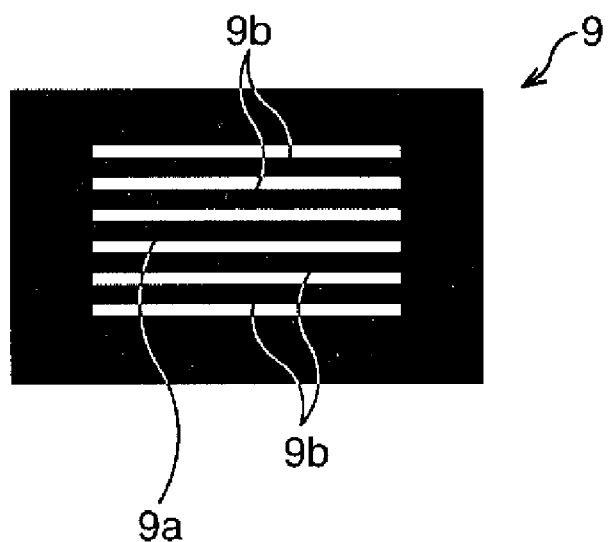
FIG. 14 is a schematic plane view showing one example of a double pole illumination.

In this example, the case where the most frequent pattern is the second mask pattern 52a extending in the vertical direction is shown as an example, but as shown in, for example, in FIG. 14, when the most frequent pattern of a second photomask 9 is a second mask pattern 9a extending in the lateral direction in the drawing, and auxiliary mask patterns 9b are provided as well as the second mask pattern 9a are provided in the second photomask 9, the double pole illumination 16 including a pair of illumination modes 16a and 16b at the regions orthogonal to the extending direction (namely, the straight line connecting the illumination modes 16a and 16b extends in the vertical direction in FIG. 3C) is used as the illumination system as shown in FIG. 3C of the first embodiment.

By the above described double exposure, as shown in FIG. 13C, in the photoresist 14, above the element isolation region 11, the second mask pattern 52a is not superimposed on the first mask pattern 51a, and therefore, the gate wiring pattern 53 remains. On the other hand, above the active region 12, the second mask pattern 52a is superimposed on the first mask pattern 51a. Therefore, a gate electrode pattern 54 extending above the active region 12 following (the reduction projection image) of the second mask pattern 52a is transferred onto the photoresist 14.

In this example, the above described exposure may be performed by using a polarized light illumination system having the function of the double pole illumination as in the first embodiment.

Figure 15:
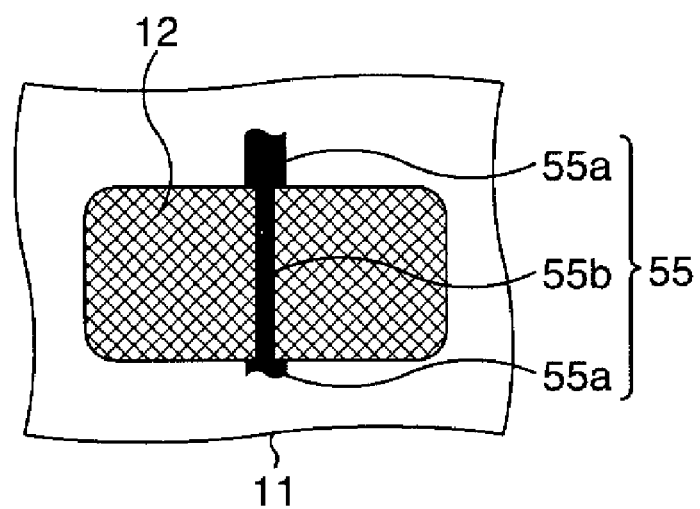
FIG. 15 is a schematic plane view showing a resist pattern formed according to the modification example 3 of the first embodiment.

Subsequently, by performing development or the like of the photoresist 14, a resist pattern 55 is formed as shown in FIG. 15.

The resist pattern 55 is made by integrally forming patterns 55a and 55b so that the pattern 55a corresponding to the wide gate wiring pattern 53 is located above the element isolation region 11, and the pattern 55b corresponding to the gate electrode pattern 54 and narrower than the pattern 55a is located above the active region 12. In this case, the gate electrode pattern 54 is transferred onto the photoresist 14 with extremely high accuracy by exposure using the above described double pole illumination 15, and therefore, the pattern 55b is formed to have a predetermined fine width with high accuracy.

As described above, according to this example, the micropattern can be formed with high accuracy with a sufficient manufacture process margin without using a photomask complicated in manufacture process at high cost like an alternating phase shift mask.

By applying the pattern forming method to formation of the gate layer as in the first embodiment, a fine MOS transistor including a gate layer with a desired fine width can be produced with high accuracy.

Modification Example 4

Figure 16A:
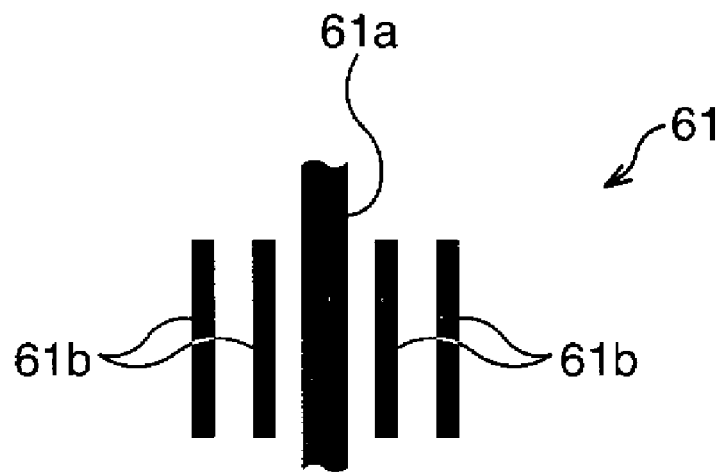
FIGS. 16A and 16B are schematic plane views showing a pair of photomasks used in a modification example 4 of the first embodiment.
Figure 16B:
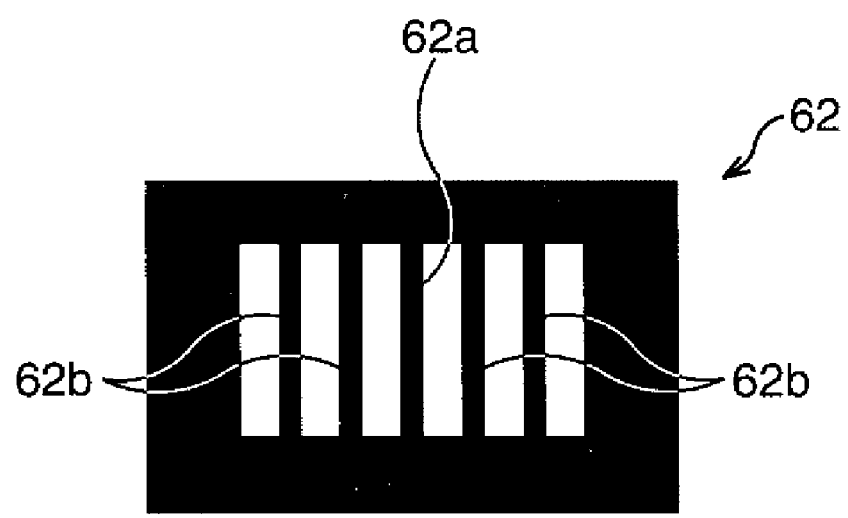
Figure 17A:
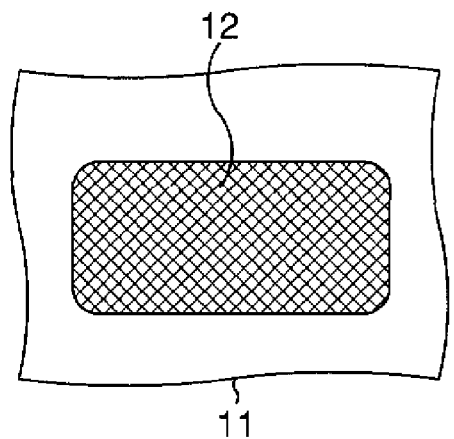
FIGS. 17A to 17C are schematic plane views for explaining a pattern forming method according to the modification example 4 of the first embodiment.
Figure 17B:
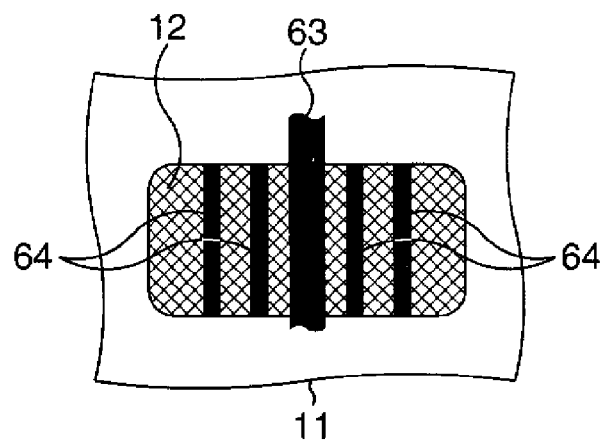
Figure 17C:
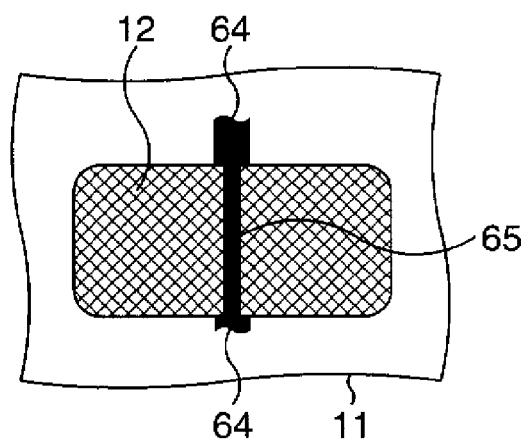

FIGS. 16A and 16B are schematic plane views showing a pair of photomasks used in a modification example 4, and FIGS. 17A to 17C are schematic plane views for explaining a pattern forming method according to the modification example 4.

In this example, a gate layer is formed by performing double exposure using a first photomask 61 and a second photomask 62 as shown in FIGS. 16A and 16B. As the photomasks 61 and 62, photomasks each with one gate pattern formed are shown as examples, but they are strictly for the purpose of convenience of explanation, and it is naturally possible to apply this modification example to a photomask including a plurality of gate patterns as in FIGS. 1A and 1B of the first embodiment.

The first photomask 61 is an ordinary chrome mask, an attenuated phase shift mask or the like, and is made by forming a band-shaped first mask pattern 61a having a width corresponding to a gate wiring to be formed, and a plurality of first auxiliary mask patterns 61b provided side by side as striped pitch patterns in parallel with the first mask pattern 61a. The first auxiliary mask pattern 61b is formed to further enhance a process margin on the occasion of exposing the first mask pattern 61a.

The second photomask 62 is an ordinary chrome mask, an attenuated phase shift mask or the like which is not an alternating phase shift mask as the first photomask 61. The second photomask 62 is made by forming a band-shaped second mask pattern 62a which has a width corresponding to a gate electrode to be formed (narrower than the gate wiring) and is narrower than the first mask pattern 61a to overlap the first mask pattern 61a, and a plurality of auxiliary mask patterns 62b provided side by side as striped pitch patterns in parallel with the second mask pattern 62a, as shown in FIG. 16B. The second auxiliary mask patterns 62b are formed to further enhance the process margin on the occasion of exposing the second mask pattern 62a. In this case, in the second photomask 62, the exposed portions of the second auxiliary mask patterns 62b correspond to the light transmitting portions of the first photomask 61, namely, the regions between the first mask pattern 61a and the first auxiliary mask patterns 61b or the regions between the adjacent first mask patterns 61b, and therefore, the second auxiliary mask patterns 62b do not overlap the first mask pattern 61a and the first auxiliary mask patterns 61b.

Usually, an assist feature assists exposure of a mask pattern, and therefore, the assist feature itself needs to be in the state in which it is not transferred (for example, to be formed to have the width not more than exposure limit). Like this, the assist feature has a large constraint imposed on its size while it can obtain an extremely large process margin. On the other hand, in this example, the exposed portions of the first auxiliary mask patterns 61b correspond to the light transmitting portions of the second photomask 62, and the exposed portions of the second auxiliary mask patterns 62b correspond to the light transmitting portions of the first photomask 61, respectively. Therefore, the auxiliary mask patterns 61b and 62b do not have to be especially formed into the state in which they are not transferred. Therefore, the first auxiliary mask pattern 61b can be formed to have such a size as to be transferred with the first mask pattern 61a if a single exposure using only the first photomask 61 is performed. Similarly, the second auxiliary mask pattern 62b can be formed to have such a size as to be transferred with the second mask pattern 62a if a single exposure using only the second photomask 62 is performed. Namely, in this example, a constraint is not imposed on the size of the auxiliary mask patterns 61b and 62b, and the auxiliary mask patterns are provided at both the photomasks 61 and 62. Therefore, a larger process margin can be obtained than when the auxiliary mask patterns are provided at either one of them.

As shown in FIG. 17A, on a silicon substrate which is a transfer object, the element isolation region 11, and the active region 12 which is defined by the element isolation region 11 are formed. In this state, a gate insulating film, a polycrystalline silicon film, and an etching hard mask such as a silicon oxide film (all not shown) are formed in sequence on the active region 12, and the photoresist 14 and the antireflection film (not shown) are coated and formed on the entire surface.

First, as shown in FIG. 17B, the first mask pattern 61a and the first auxiliary mask patterns 61b are exposed onto the photoresist 14 above the silicon substrate by using the first photomask 61. By the exposure, a latent image of a gate wiring pattern 63 extending laterally across the active region 12 following (the reduction projection image of) the first mask pattern 61a is transferred onto the photoresist 14. At this time, the auxiliary mask patterns 61b are formed to have widths not less than exposure limit to obtain a process margin, and therefore, in the photoresist 14, latent images of the striped assist features 64 are transferred to be adjacent to the gate wiring pattern 63.

Subsequently, by using the second photomask 62, the second mask pattern 62a and the auxiliary mask patterns 61b are exposed onto the photoresist 14 so as to overlap the first mask pattern 61a above the active region 12. In this example, double pole illumination is used as a illumination system on the occasion of the exposure. In this case, as the double pole illumination optimized for the most frequent pattern, when the most frequent pattern is a band-shaped pattern extending in one direction, a double pole illumination including a pair of illumination modes at the regions orthogonal to the extending direction is used as the illumination system, and exposure is performed. If the mask pattern to be exposed is extremely fine to such an extent that it is formed with high accuracy by using, for example, an alternating phase shift mask, it becomes possible to transfer the mask pattern with high accuracy with an extremely large exposure margin equivalent to the case where the alternating phase shift mask is used, by performing exposure with the double pole illumination optimized for the most frequent pattern in an ordinary chrome mask, an attenuated phase shift mask or the like.

More specifically, in the second photomask 62, the second mask pattern 62a is formed into the shape extending in the vertical direction in FIG. 16B, and therefore, as shown in FIG. 3A of the first embodiment, the double pole illumination 15 including a pair of illumination modes 15a and 15b at the regions orthogonal to the extending direction (namely, the straight line connecting the illumination modes 15a and 15b extends in the lateral direction in FIG. 1B) is used as the illumination system. By performing exposure by using the double pole illumination 15 with a pair of illumination modes 15a and 15b located in the lateral direction, which is optimized for the second mask pattern 62a like this, it becomes possible to obtain very steep light intensity for the second mask pattern 62a extending in the vertical direction, without using a special photomask like an alternating phase shift mask. Accordingly, it becomes possible to transfer the second mask pattern 62a onto the photoresist 14 with high accuracy with an extremely large exposure margin equivalent to the case where an alternating phase shift mask is used.

In this case, as described above, the exposed portions of the first auxiliary mask patterns 61b correspond to the light transmitting portions of the second photomask 62, and therefore, the assist features 64, which are the transfer images of the auxiliary mask patterns 61b, disappear by the double exposure. Further, the second auxiliary mask patterns 62b are formed to have widths of not less than exposure limit to obtain a process margin, and therefore, the striped assist features are exposed to be adjacent to the gate wiring pattern 63 in the photoresist 14. However, as described above, the exposed portions of the second auxiliary mask patterns 62b correspond to the light transmitting portions of the first photomask 61, and therefore, the second auxiliary mask patterns 62b are not transferred by the double exposure, and only the second mask pattern 62a is transferred onto the photoresist 14.

In this example, the case where the most frequent pattern is the second mask pattern 62a extending in the vertical direction is shown as an example, but similarly to, for example, the modification example 3, as shown in FIG. 14, when the most frequent pattern of the second photomask 9 is the second mask pattern 9a extending in the lateral direction in the drawing, and the auxiliary mask patterns 9b are provided together with the second mask pattern 9a in the second photomask 9, the double pole illumination 16 including a pair of illumination modes 16a and 16b at the regions orthogonal to the extending direction (namely, the straight line connecting the illumination modes 16a and 16b extends in the vertical direction in FIG. 3C) is used as the illumination system as shown in FIG. 3C of the first embodiment.

By the above described double exposure, as shown in FIG. 17C, in the photoresist 14, above the element isolation region 11, the second mask pattern 62a is not superimposed on the first mask pattern 61a, and therefore, the gate wiring pattern 63 remains. On the other hand, above the active region 12, the second mask pattern 62a is superimposed on the first mask pattern 61a. Therefore, a gate electrode pattern 65 extending above the active region 12 following (the reduction projection image) of the second mask pattern 62a is transferred onto the photoresist 14.

In this example, the above described exposure may be performed by using a polarized light illumination system having the function of the double pole illumination as in the first embodiment.

Figure 18:
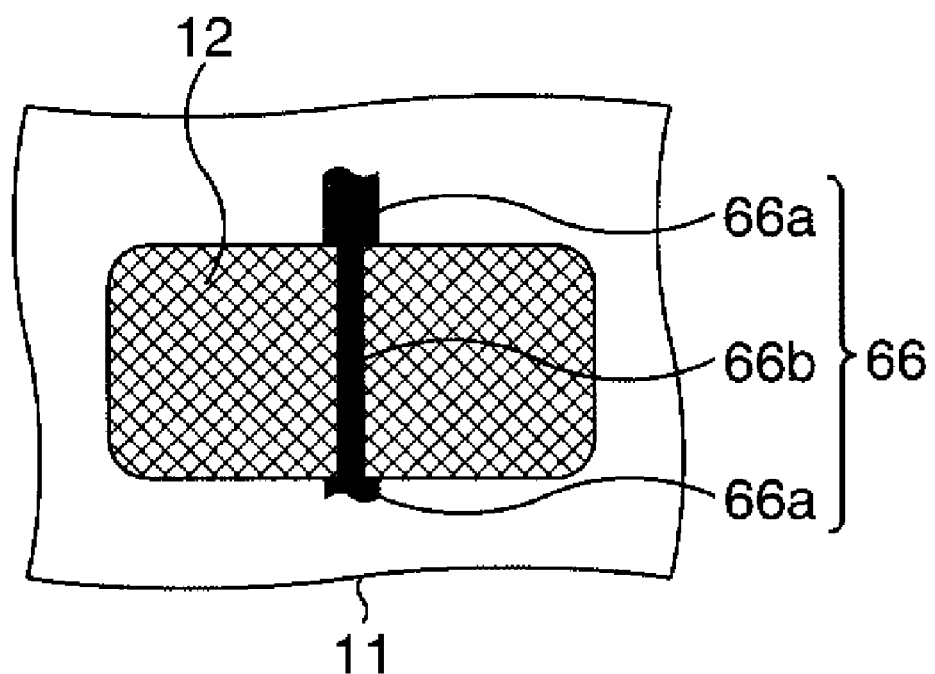
FIG. 18 is a schematic plane view showing a resist pattern formed according to the modification example 4 of the first embodiment.

Subsequently, by performing development or the like of the photoresist 14, a resist pattern 66 is formed as shown in FIG. 18.

The resist pattern 66 is made by integrally forming patterns 66a and 66b so that the pattern 66a corresponding to the wide gate wiring pattern 63 is located above the element isolation region 11, and the pattern 66b which corresponds to the gate electrode pattern 65 and is narrower than the pattern 66a is located above the active region 12. In this case, the gate electrode pattern 65 is transferred onto the photoresist 14 with extremely high accuracy by exposure using the above described double pole illumination 15, and therefore, the pattern 66b is formed to have a predetermined fine width with high accuracy.

As described above, according to this example, the micro-pattern can be formed with high accuracy with a sufficient manufacture process margin without using a photomask complicated in manufacture process at high cost like an alternating phase shift mask.

By applying the pattern forming method to formation of the gate layer as in the first embodiment, a fine MOS transistor including a gate layer with a desired fine width can be fabricated with high accuracy.

Second Embodiment

Figure 19A:
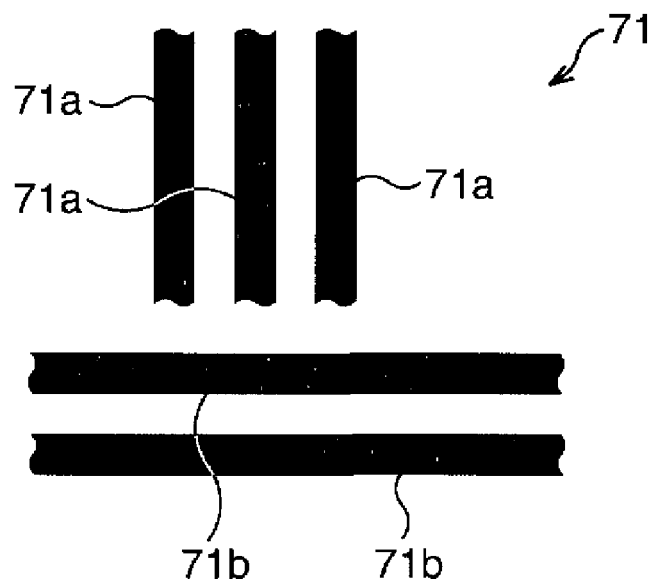
FIGS. 19A and 19B are schematic plane views showing a pair of photomasks used in a second embodiment.
Figure 19B:
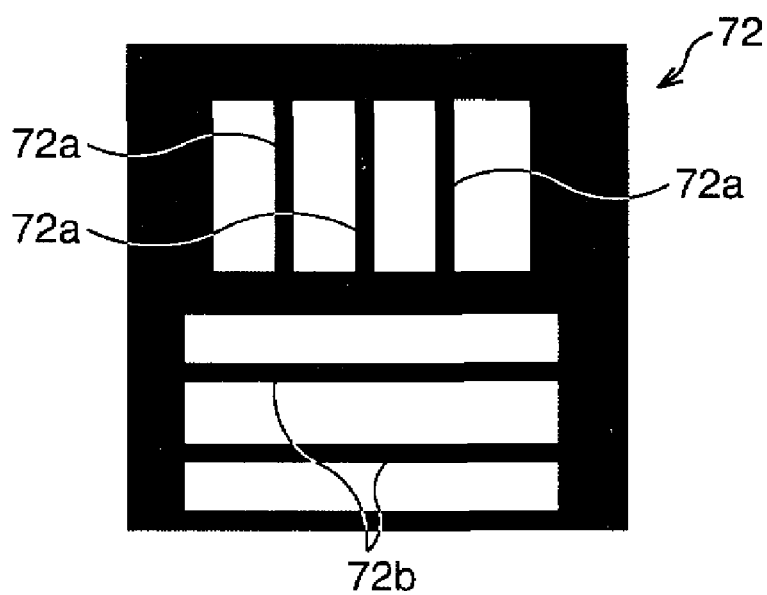
Figure 20A:
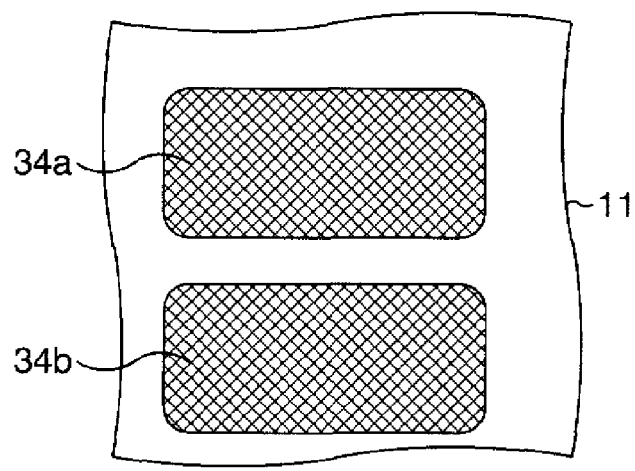
FIGS. 20A to 20C are schematic plane views for explaining a pattern forming method according to the second embodiment.
Figure 20B:
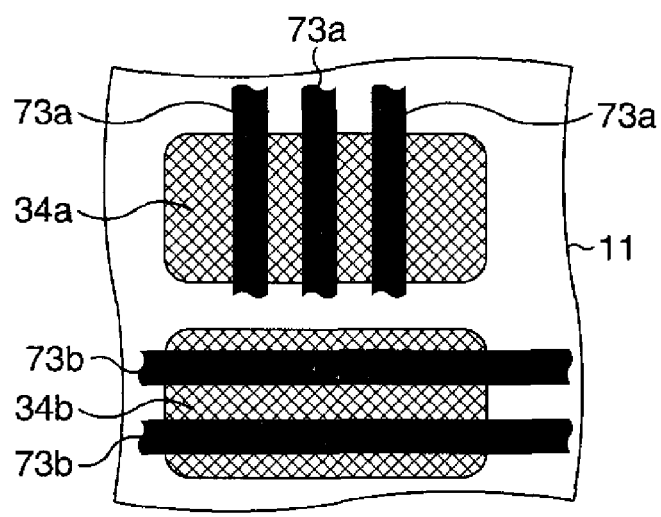
Figure 20C:
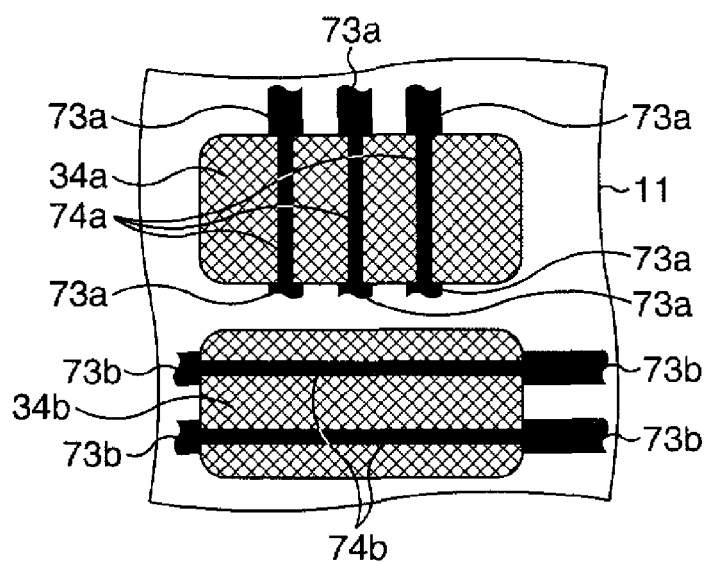

In this embodiment, as in the first embodiment, the case where a gate layer pattern is transferred to a photoresist on a semiconductor substrate by a photolithography technique will be shown as an example. FIGS. 19A and 19B are schematic plane views showing a pair of photomasks used in a second embodiment, and FIGS. 20A to 20C are schematic plane views for explaining a pattern forming method according to the second embodiment.

In this embodiment, gate layers differ in extending direction are formed by double exposure using a first photomask 71 and a second photomask 72 as shown in FIGS. 19A and 19B.

The first photomask 71 is an ordinary chrome mask, an attenuated phase shift mask or the like, and is made by forming band-shaped first mask patterns 71a each having a width corresponding to a gate wiring to be formed, and extending in the vertical direction in the drawing, as shown in FIG. 19A, and band-shaped first mask patterns 71b each having a width corresponding to the gate wiring to be formed, and extending in the direction orthogonal to the first mask patterns 71a, in the lateral direction in the drawing in this case.

The second photomask 72 is an ordinary chrome mask, an attenuated phase shift mask or the like which is not an alternating phase shift mask as the first photomask 71. The second photomask 72 is made by forming second mask patterns 72a and 72b as shown in FIG. 19B. The second mask patterns 72a are band-shaped mask patterns each having a width corresponding to the gate electrode to be formed (narrower than the gate wiring) so as to overlap the first mask patterns 71a, narrower than the first mask patterns 71a and extending in the vertical direction. The second mask patterns 72b are band-shaped mask patterns each having a width corresponding to the gate electrode to be formed (narrower than the gate wiring), narrower than the first mask patterns 71b and extending in the lateral direction.

As shown in FIG. 20A, the element isolation region 11, and active regions 34a and 34b which are defined by the element isolation region 11 are formed on the silicon substrate which is a transfer object. The active region 34a is made a rectangle longer in the lateral direction in the drawing, and the active region 34b is made a rectangle longer in the vertical direction in the drawing. In this state, a gate insulating film, a polycrystalline silicon film, and an etching hard mask such as a silicon oxide film (all are not shown) are formed in sequence, and the photoresist 14 and the antireflection film (not shown) are coated and formed on the entire surface.

First, as shown in FIG. 20B, the first mask patterns 71a and 71b are exposed onto the photoresist 14 above the silicon substrate by using the first photomask 71. By this exposure, latent images of gate wiring patterns 73a extending laterally across the active region 34a following (the reduction projection images of) the first mask patterns 71a, and latent images of the gate wiring patterns 73b extending longitudinally across the active region 34b following (the reduction projection image) of the first mask patterns 71b are transferred onto the photoresist 14.

Subsequently, the second mask patterns 72a are exposed onto the photoresist 14 so as to overlap the first mask patterns 71a above the active region 34a by using the second photomask 72, and the second mask patterns 72b are exposed onto the photoresist 14 so as to overlap the first mask patterns 71b above the active region 34b.

In this embodiment, quadrupole illumination is used as an illumination system on the occasion of exposure using the second photomask 72. In this case, as each double pole illumination which is optimized for two kinds of most frequent patterns, the quadrupole illumination, which is made by combining the double pole illumination including a pair of illumination modes at the regions orthogonal to the one direction in the case where one of the most frequent patterns is a band-shaped pattern which extends in one direction, and the double pole illumination including a pair of illumination modes at the regions orthogonal to the other direction in the case where the other most frequent pattern is a band-shaped pattern which extends in the other direction orthogonal to the one direction, is used as the illumination system to perform exposure. Even if the mask pattern to be exposed is extremely fine to such an extent that it is formed with high accuracy by using, for example, an alternating phase shift mask, it becomes possible to transfer the mask pattern with high accuracy with an extremely large exposure margin equivalent to the case where the alternating phase shift mask is used, by performing exposure with the quadrupole illumination which is optimized for each of the most frequent patterns in an ordinary chrome mask, an attenuated phase shift mask or the like.

Figure 21:
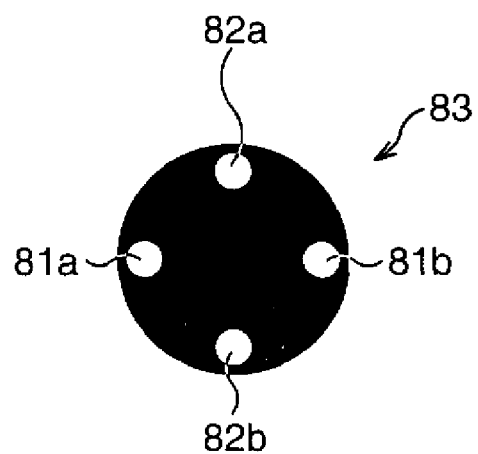
FIG. 21 is a schematic plane view showing one example of quadrupole illumination.

More specifically, in the second photomask 72, the second mask patterns 72a are formed in the shapes which extend in the vertical direction, and the second mask patterns 72b are in the shapes which extend in the lateral direction, in FIG. 19B. Therefore, as shown in FIG. 21, in order to perform exposure optimized for the second photomask 72, quadrupole pole illumination 83 which is provided with a pair of illumination modes 81a and 81b at regions orthogonal to the extending direction of the second mask pattern 72a, and a pair of illumination modes 82a and 82b at the regions orthogonal to the extending direction of the second mask pattern 72b is used as the illumination system.

By performing exposure by using the quadrupole illumination 83 including a pair of illumination modes 81a and 81b, and a pair of illumination modes 82a and 82b orthogonal to them, which is optimized for the second mask patterns 72a and 72b, it becomes possible to obtain very steep light intensity for the second mask patterns 72a extending in the vertical direction and the second mask patterns 72b extending in the lateral direction, without using a special photomask like an alternating phase shift mask. Accordingly, it becomes possible to transfer the second mask patterns 72a and 72b onto the photoresist 14 with high accuracy with an extremely large exposure margin equivalent to the case where an alternating phase shift mask is used.

By the above described double exposure, in the photoresist 14, gate wiring patterns 73a and 73b remain above the element isolation region 11, because the second mask patterns 72a are not superimposed on the first mask patterns 71a, and the second mask patterns 72b are not superimposed on the first mask patterns 71b as shown in FIG. 20C. On the other hand, above the active region 34a, the second mask patterns 72a are superimposed on the first mask patterns 71a, and above the active region 34b, the second mask patterns 72b are superimposed on the first mask patterns 71b. Therefore, gate electrode patterns 74a extending above the active region 34a following (the reduction projection images of) the second mask patterns 72a, and gate electrode patterns 74b extending on the active region 34b following (the reduction projection images) of the second mask patterns 72b are respectively transferred onto the photoresist 14.

In this embodiment, the above described exposure may be performed by using a polarized light illumination system having the function of the quadrupole pole illumination as in the first embodiment.

Figure 22:
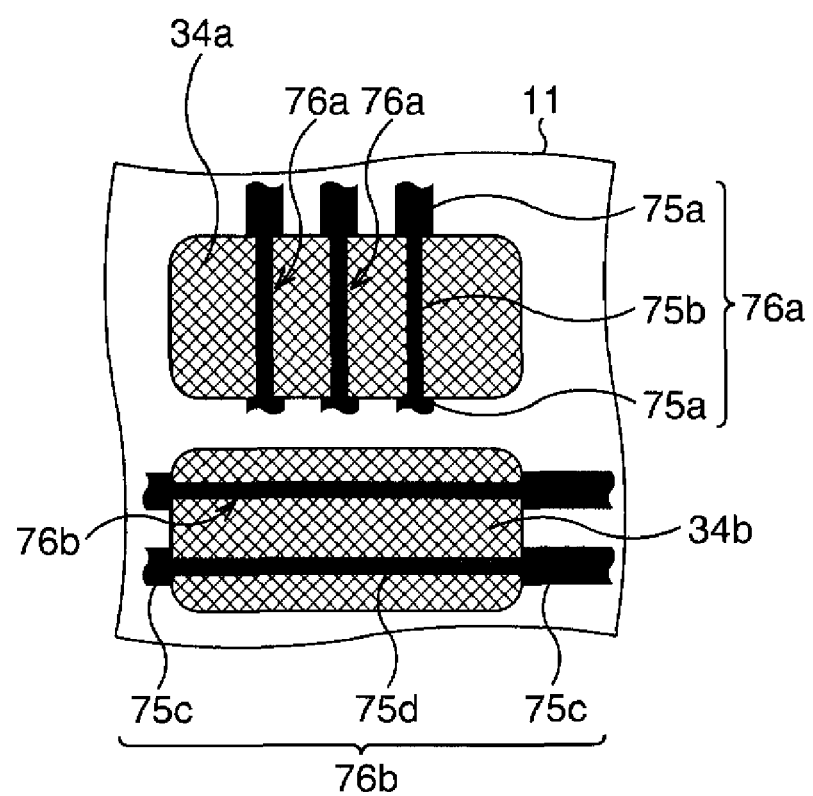
FIG. 22 is a schematic plane view showing a resist pattern formed according to the second embodiment.

Then, by performing development or the like of the photoresist 14, resist patterns 76a and 76b are formed as shown in FIG. 22.

The resist pattern 76a is made by integrally forming patterns 75a and 75b so that the pattern 75a corresponding to the wide gate wiring pattern 73a is located above the element isolation region 11, and the pattern 75b which corresponds to the gate electrode pattern 74a and is narrower than the pattern 75a is located above the active region 34a.

The resist pattern 76b is made by integrally forming patterns 75c and 75d so that the pattern 75c corresponding to the wide gate wiring pattern 73b is located above the element isolation region 11, and the pattern 75d which corresponds to the gate electrode pattern 74b and is narrower than the pattern 75c is located above the active region 34b.

Here, the gate electrode patterns 73a and 73b are transferred onto the photoresist 14 with extremely high accuracy by exposure using the above described quadrupole illumination 83, and therefore, the patterns 75b and 75d are formed into a predetermined fine width with high accuracy.

As described above, according to the present embodiment, on formation of two kinds of gate layer patterns differing in extending direction (extending in the orthogonal direction to each other), micropatterns can be formed with high accuracy with a sufficient manufacture process margin by double exposure, without using a photomask complicated in manufacture process at high cost like an alternating phase shift mask.

As in the first embodiment, by applying the pattern forming method to formation of a gate layer, a fine MOS transistor including a gate layer with a desired fine width can be produced with high accuracy.

In the present embodiment, an auxiliary mask pattern may be provided at one or both of the first photomask 71 and the second photomask 72 so as not to overlap the mask patterns or the like between both the photomasks as in the modification examples 2 to 4 of the first embodiment. By these constructions, the process margin can be further increased.

Third Embodiment

In this embodiment, as in the first embodiment, the case where a gate layer pattern is transferred to a photoresist on a semiconductor substrate by a photolithography technique will be shown as an example.

Figure 23A:
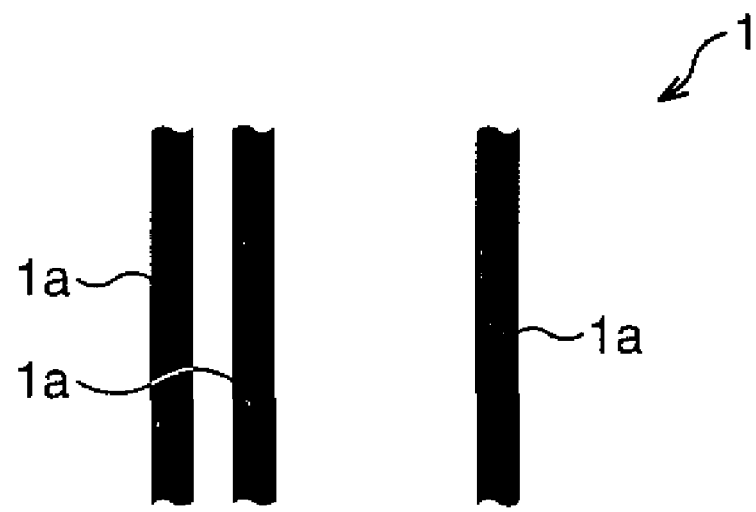
FIGS. 23A and 23B are schematic plane views showing a pair of photomasks used in a third embodiment.
Figure 23B:
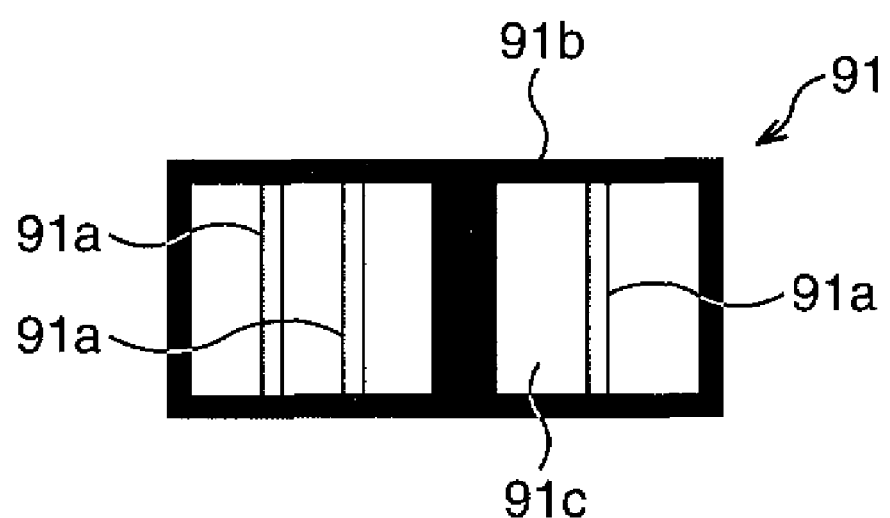

FIGS. 23A and 23B are schematic plane views showing a pair of photomasks used in a third embodiment, and FIGS.

24A and 24B are schematic plane views for explaining a pattern forming method according to the third embodiment.

In this embodiment, a gate layer is formed by double exposure using the first photomask 1 and a second photomask 91 as shown in FIGS. 23A and 23B.

The first photomask 1 is an ordinary chrome mask, an attenuated phase shift mask or the like, and is made by forming band-shaped first mask patterns 1a each having a width corresponding to a gate wiring to be formed, as shown in FIG. 23A.

The second photomask 91 is a mask which is not an alternating phase shift mask, and is a so-called tri-tone mask in which a chrome mask and an attenuated phase shift mask are mixedly present as shown in FIG. 23B. A tri-tone mask has a relatively simple constitution and is at low cost as a chrome mask and an attenuated phase shift mask. The second photomask 91 is made to have a width corresponding to the gate electrode to be formed (narrower than the gate wiring), band-shaped second mask patterns 91a narrower than the first mask patterns 1a are made half tone (HT) regions, a portion connected to end portions of the second mask patterns 91a (portion enclosing a plurality of second mask patterns 91a) is made a chrome (Cr) region 91b, light transmitting portions between the second mask patterns 91a are made quartz (Qz) regions 91c as an ordinary attenuated phase shift mask (also used in the first and the second embodiments).

Figure 24A:
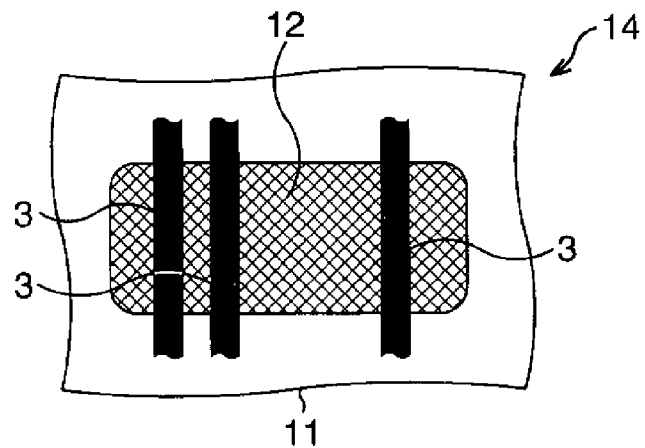
FIGS. 24A and 24B are schematic plane views for explaining a pattern forming method according to the third embodiment.

In this embodiment, first, as shown in FIG. 2B shown in the first embodiment, the first mask patterns 1a are exposed onto the photoresist 14 above the silicon substrate by using the first photomask 1, as shown in FIG. 24A. By this exposure, latent images of gate wiring patterns 3 extending laterally across the active region 12 following (the reduction projection images of) the first mask patterns 1a are transferred onto the photoresist 14.

Subsequently, the second mask patterns 91a are exposed onto the photoresist 14 so as to overlap the first mask patterns 1a above the active region 12 by using the second photomask 91. In this embodiment, the same illumination system as the double pole illumination 15 in FIG. 3A is used on the occasion of the exposure. Even if the mask pattern to be exposed is extremely fine to such an extent that it is formed with high accuracy by using, for example, an alternating phase shift mask, it becomes possible to transfer the mask pattern with high accuracy with an extremely large exposure margin equivalent to the case where the alternating phase shift mask is used, by performing exposure with the double pole illumination which is optimized for the most frequent patterns in a tri-tone mask.

In this embodiment, a very steep light intensity can be obtained for the second mask patterns 91a extending in the vertical direction without using a special photomask such as an alternating phase shift mask. Accordingly, the second mask patterns 91a can be transferred onto the photoresist 14 with high accuracy with an extremely large exposure margin equivalent to the case where the alternating phase shift mask is used.

Figure 24B:
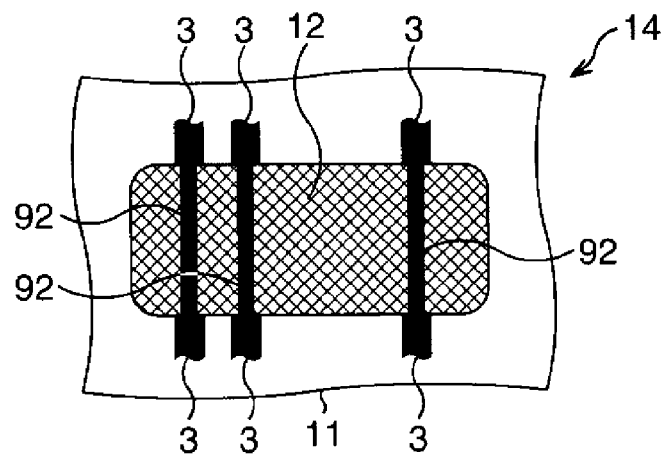

By the above described double exposure, as in FIG. 2C shown in the first embodiment, in the photoresist 14, gate wiring patterns 3 remain above the element isolation region 11, because the second mask patterns 91a are not superimposed on the first mask patterns 1a as shown in FIG. 24B. On the other hand, above the active region 12, the second mask patterns 91a are superimposed on the first mask patterns 1a. Therefore, gate electrode patterns 92 extending above the active region 12 following (the reduction projection images of) the second mask patterns 91a are respectively transferred onto the photoresist 14.

Further, in this embodiment, by using the second photomask 91 which is the tri-tone mask of the above described constitution, the following excellent effect is provided in addition to the effect of the first embodiment.

For example, in the case of constituting the second photomask as an ordinary attenuated phase shift mask, when the transmittance of the attenuated phase shift mask is, for example, 6%, 6% of light leaks in the portions superimposed on the first mask pattern 1a in double exposure, of the portion enclosing the second mask pattern 91a. In this case, there is the fear of reducing contrast of light intensity with respect to the patterns except for the gate electrode patterns 92, and decreasing a process margin correspondingly as a result. Reduction in the process margin is never fatal to the present invention, but is desired to be suppressed as much as possible.

In this embodiment, by making the portion enclosing a plurality of second mask patterns 91a the Cr region 91b, light is shielded with the Cr region 91b from the portions superimposed on the first mask patterns 1a in the double exposure, and light leakage is suppressed. Since the second mask pattern 91a is made the HT region, the phase of it is shifted by $\pi$ (180°) from that of the adjacent Qz region 91c, light intensity becomes very steep, and very wide depth of focus is obtained. By this constitution, a pattern failure due to light leakage does not occur to the portions of the patterns except for the gate electrode pattern 92, the gate wiring patterns 3 in this case, which are connected to the gate electrode patterns 92, and double exposure is carried out to be in a desired state.

Figure 25:
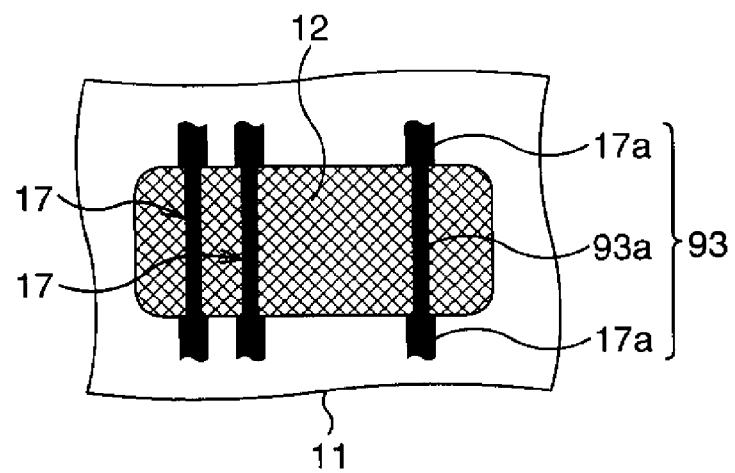
FIG. 25 is a schematic plane view showing a resist pattern formed according to the third embodiment.
Figure 26A:
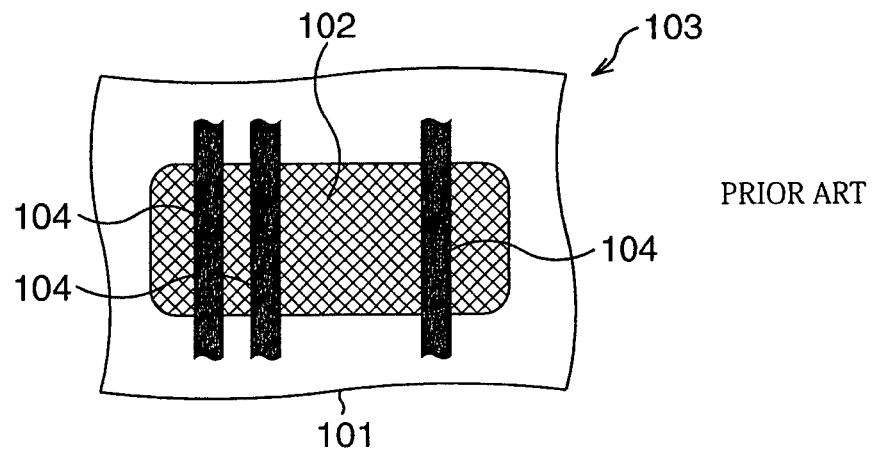
FIGS. 26A to 26C are schematic plane views showing one example of a conventional double exposure process.
Figure 26B:
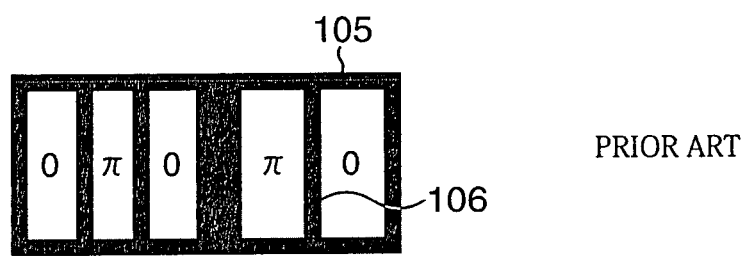
Figure 26C:
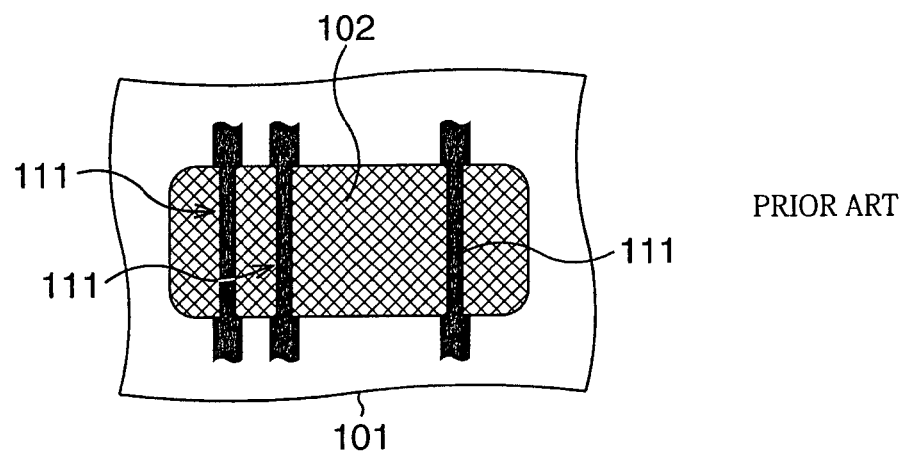

Then, by performing development or the like of the photoresist 14, a resist pattern 93 is formed as shown in FIG. 25.

The resist pattern 93 is made by integrally forming patterns 17a and 93a so that the patterns 17a corresponding to the wide gate wiring patterns 3 are located above the element isolation region 11, and the pattern 93a which corresponds to the gate electrode pattern 92 and is narrower than the pattern 17a is located above the active region 12. In this case, the gate electrode pattern 92 is transferred to the photoresist 14 with extremely high accuracy by the exposure using the above described double pole illumination in the state in which light leakage is suppressed as described above, and therefore, the pattern 93a is formed into a predetermined fine width with extremely high accuracy.

As described above, according to this embodiment, micropatterns can be formed with extremely high accuracy with a sufficient manufacture process margin without using a photomask which is complicated in manufacture process and high in manufacture cost like an alternating phase shift mask.

As in the first embodiment, by applying the pattern forming method to formation of a gate layer, a fine MOS transistor including a gate layer with a desired fine width can be produced with high accuracy.

In this embodiment, an auxiliary mask pattern or auxiliary mask patterns may be provided at one or both of the first photomask 1 and the second photomask 91 so as not to overlap the mask patterns or the like between both the photomasks as in the modification examples 2 to 4 of the first embodiment. In this case, the auxiliary mask pattern may be of any of the HT region and the Cr region. By these constitutions, the process margin can be further increased.

Further, the technical idea of this embodiment may be applied to the second embodiment. Specifically, it is preferable to constitute the second photomask as a tri-tone mask similar to that in this embodiment, form the second mask pattern as the HT region, and use quadrupole illumination for double exposure.

In each of the above described embodiments and modification examples, the case using the double pole illumination or the quadrupole illumination as the modified illumination system is described, but multipole illumination (sextupole illumination, octupole illumination or the like) differing in illumination mode may be used in accordance with the pattern to be transferred and formed.

According to the present invention, micropatterns can be formed with high accuracy with a sufficient manufacture process margin without using a photomask complicated in manufacture process at high cost like an alternating phase shift mask.

By applying the pattern forming method to formation of gate layers of a semiconductor device, a liquid crystal device and the like, fine transistors including gate layers with desired fine widths can be produced with high accuracy.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device, comprising:
    a first mask pattern being formed on a first photomask and a second mask pattern being formed on a second photomask respectively,
    wherein in at least one of the first photomask and the second photomask, a plurality of assist patterns which is not superimposed on the mask pattern of the other on an occasion of exposure and which is provided side by side as a striped pitch pattern in parallel with the first mask pattern or the second mask pattern is formed, and
    said method further comprising,
    a first exposing step of exposing the first mask pattern to a transfer object by using the first photomask; and
    a second exposing step of exposing the second mask pattern to the transfer object so that at least a part of the second mask pattern is superimposed on the first mask pattern, by using the second photomask;
    wherein in said second exposing step, the second mask pattern is exposed onto the transfer object by using a tri-tone mask in which a chrome mask and an attenuated phase shift mask are mixedly present, as the second photomask, and
    wherein at least one of the first exposing step and the second exposing step is performed by using double pole illumination.

2. The manufacturing method of the semiconductor device according to claim 1,
    wherein in the second photomask, a portion corresponding to the second mask pattern is made a half tone region, and a portion connected to an end portion of the second mask pattern is made a chrome region.

3. The manufacturing method of the semiconductor device according to claim 1,
    wherein in said first exposing step, the first mask pattern has a first pattern extending in a first direction, and a second pattern extending in a second direction orthogonal to the first direction, and
    wherein in said second exposing step, the second mask pattern has a third pattern extending in the first direction, which is exposed to be superimposed on the first pattern,
    said method further comprising,
    a third exposing step of exposing a fourth pattern extending in the second direction to the transfer object to be superimposed on the second pattern by using a third photomask,
    wherein an illumination mode of the double pole illumination in said second exposing step, and an illumination mode of the double pole illumination in said third exposing step differ from each other.

4. The manufacturing method of the semiconductor device according to claim 3,
    wherein in said second and third exposing steps, the second and a third mask patterns are exposed to the transfer object by using tri-tone masks in which chrome masks and attenuated phase shift masks are mixedly present respectively, as the second and the third photomasks.

5. The manufacturing method of the semiconductor device according to claim 4,
    wherein in each of the second and third photomasks, a portion corresponding to the second mask pattern is made a half tone region, and a portion connected to an end portion of the second mask pattern is made a chrome region.

6. The manufacturing method of the semiconductor device according to claim 3,
    wherein in at least one of the first photomask, the second photomask and the third photomask, an assist pattern which is not superimposed on the mask patterns of the other photomasks on an occasion of exposure is formed.

7. The manufacturing method of the semiconductor device according to claim 1,
    wherein the assist patterns are transferred to the transfer object when exposed by solely using the photomask in which the assist patterns are formed.

8. The manufacturing method of the semiconductor device according to claim 1,
    wherein the exposure is performed by using a polarized light illumination system having a function of the double pole illumination.

9. The manufacturing method of the semiconductor device according to claim 1,
    wherein a plurality of the assist patterns which is in parallel with the first photomask pattern or the second photomask pattern is provided on the left side and the right side of the first photomask pattern or the second photomask pattern respectively, and the intervals between the adjacent assist patterns are the same.

10. A manufacturing method of a semiconductor device, comprising:
    a first mask pattern being formed on a first photomask and a second mask pattern being formed on a second photomask respectively,
    wherein in at least one of the first photomask and the second photomask, a plurality of assist patterns which is not superimposed on the mask pattern of the other on an occasion of exposure and which is provided side by side as a striped pitch pattern in parallel with the first mask pattern or the second mask pattern is formed,
    said method further comprising,
    a first exposing step of exposing a first pattern and a second pattern included in the first mask pattern and differing in extending direction to a transfer object by using the first photomask; and
    a second exposing step of exposing a third pattern and a fourth pattern included in the second mask pattern to the transfer object so that at least a part of the first mask pattern is superimposed on the second mask by using the second photomask,
    wherein in said second exposing step, the second mask pattern is exposed to the transfer object by using a tri-tone mask in which a chrome mask and an attenuated phase shift mask are mixedly present, as the second photomask, and wherein at least one of said first exposing step and said second exposing step is performed by using quadrupole illumination.

11. The manufacturing method of the semiconductor device according to claim 10, wherein the first pattern and the second pattern extend in directions orthogonal to each other, and the third pattern and the fourth pattern extend in directions orthogonal to each other.

12. The manufacturing method of the semiconductor device according to claim 10, wherein in the second photomask, a portion corresponding to the second mask pattern is made a half tone region, and a portion connected to an end portion of the second mask pattern is made a chrome region.

13. The manufacturing method of the semiconductor device according to claim 10, wherein the assist patterns are transferred to the transfer object when exposed by solely using the photomask in which the assist patterns are formed.

14. The manufacturing method of the semiconductor device according to claim 10, wherein the exposure is performed by using a polarized light illumination system having a function of the quadrupole illumination.

15. The manufacturing method of the semiconductor device according to claim 10, wherein a plurality of the assist patterns which is in parallel with the first photomask pattern or the second photomask pattern is provided on the left side and the right side of the first photomask pattern or the second photomask pattern respectively, and the intervals between the adjacent assist patterns are the same.

* * * * *